(12) United States Patent
Iwasaki et al.

(10) Patent No.: US 6,278,231 B1
(45) Date of Patent: Aug. 21, 2001

(54) NANOSTRUCTURE, ELECTRON EMITTING DEVICE, CARBON NANOTUBE DEVICE, AND METHOD OF PRODUCING THE SAME

(75) Inventors: Tatsuya Iwasaki, Machida; Tohru Den, Tokyo, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/276,667

(22) Filed: Mar. 26, 1999

(30) Foreign Application Priority Data

Mar. 27, 1998 (JP) .................................................. 10-098114
Feb. 25, 1999 (JP) .................................................. 11-047540

(51) Int. Cl.$^7$ ..................................................... H01J 1/02
(52) U.S. Cl. ............................................. 313/310; 445/50
(58) Field of Search .................................. 313/309, 310, 313/351, 336; 445/50, 51

(56) References Cited

U.S. PATENT DOCUMENTS

| 3,850,762 | * | 11/1974 | Smith ...................................... 204/11 |
| 4,687,551 | * | 8/1987 | Furneaux et al. ....................... 204/11 |
| 4,737,799 | | 4/1988 | Kato ................................. 346/76 PH |
| 5,077,114 | * | 12/1991 | Wada et al. ........................... 428/131 |
| 5,089,092 | | 2/1992 | Wada et al. ............................. 205/75 |
| 5,259,957 | * | 11/1993 | Rosenfeld et al. ................... 210/490 |
| 5,811,917 | * | 9/1998 | Sekinger et al. ...................... 313/336 |
| 5,866,975 | * | 2/1999 | Gartner et al. ....................... 313/346 |
| 5,975,976 | * | 11/1999 | Sekinger et al. ....................... 445/50 |

FOREIGN PATENT DOCUMENTS 0 913 508   5/1969   (EP) .
7-272651   10/1995   (JP) .

OTHER PUBLICATIONS

Hoyer, Patrick, et al., "Preparation Of Regularly Structured Porous Metal Membranes With Two Different Hole Diameters At The Two Sides", Thin Solid Films, vol. 286, pp. 81–91 (1996).

Huang, Li–Feng, et al., "Graded Index Profile Of Anodic Alumina Films That Is Induced By Conical Pores", Applied Optics, vol. 32, No. 12, pp. 2039–2044 (Apr. 20, 1993).

Furneaux, R.C., et al., "The Formation Of Controlled–Porosity Membranes From Anodically Oxidized Aluminum", Nature, vol. 337, pp. 147–149 (Jan. 12, 1989).

* cited by examiner

Primary Examiner—Ashok Patel
Assistant Examiner—Matthew J. Gerike
(74) Attorney, Agent, or Firm—Fitzpatrick, Cella, Harper & Scinto

(57) ABSTRACT

The invention provides a nanostructure including an anodized film including nanoholes. The anodized film is formed on a substrate having a surface including at least one material selected from the group consisting of semiconductors, noble metals, Mn, Fe, Co, Ni, Cu and carbon. The nanoholes are cut completely through the anodized film from the surface of the anodized film to the surface of the substrate. The nanoholes have a first diameter at the surface of the anodized film and a second diameter at the surface of the substrate. The nanoholes are characterized in that either a constriction exists at a location between the surface of the anodized film and the surface of the substrate, or the second diameter is greater than the first diameter.

24 Claims, 22 Drawing Sheets

NANOSTRUCTURE, ELECTRON EMITTING DEVICE, CARBON NANOTUBE DEVICE, AND METHOD OF PRODUCING THE SAME

BACKGROUND OF THE INVENTION

1. Field of the Invention

The present invention relates to a nanostructure and a method of producing the same. The nanostructure produced by anodizing aluminum according to the present invention may be used in a wide variety of applications such as functional materials for use in electronic devices or micro devices. Specific examples include quantum effect devices, electrochemical sensors, biosensors, magnetic memories, magnetic devices, light emitting devices, photonic devices, solar cells, etc.

2. Description of the Related Art

In thin films, fine wires, and fine dots of metal or semiconductor, if motion of electrons is restricted within a region smaller than a particular length, the thin films, the fine wires, or the fine dots often exhibit special electric, optical, and/or chemical characteristics. From this point of view, materials having a fine structure (nanostructure) with a size smaller than 100 nm are attracting increasing attention as functional materials.

One known method of producing nanostructures is to employ a semiconductor processing technique including a fine pattern writing technique such as photolithography, electron-beam lithography, and X-ray lithography.

In addition to the production method described above, a self-forming technique is being developed. In this technique, a self-formed periodic structure is used to realize a novel nanostructure. This technique has a potential ability to produce a peculiar nanostructure including a finer structure, depending on a fine structure used as a base, than can be obtained by the conventional technique, and thus a lot of investigations are being performed.

An example of a self-formed peculiar structure is an anodized aluminum oxide film (refer to, for example, R. C. Furneaux, W. R. Rigby and A. P. Davidson, NATURE, Vol. 337, P. 147 (1989)). If an aluminum plate is anodized in an acid electrolyte, a porous oxide film is formed. FIG. 3A is a cross-sectional view schematically illustrating a nanostructure obtained by anodizing an aluminum plate 31 so as to form a porous anodized film 32 on the surface of the aluminum plate 31. FIG. 3B is a cross-sectional view schematically illustrating a nanostructure obtained by anodizing the surface of a thin aluminum film 34 formed for example on a semiconductor substrate 33 so as to form a porous anodized film 32. As can be seen from FIGS. 3A and 3B, the feature of the anodized film is that it has a peculiar geometric structure including very small cylindrical holes (nanoholes) 35 which have diameters 2r ranging from several nm to several hundred nm and which are arranged in parallel at intervals of several ten nm to several hundred nm. The cylindrical nanoholes 35 have a large aspect ratio and have good uniformity in terms of the diameter over the entire length.

The diameter 2r of the nanoholes 35 and the hole-to-hole distance 2R can be controlled to a certain extent by adjusting the current and voltage during the anodization process. There is a barrier layer (aluminum oxide layer) 36 between the anodized film 32 and the aluminum substrate 31 or the aluminum film 34. A various applications are being attempted to take the advantages of such peculiar geometric structures obtained in anodized films. For example, anodized films may be used as films having high abrasion resistance and high dielectric strength. An anodized film may be separated from an underlying material and may be used as a filter. Furthermore, by filling the nanoholes with metal or semiconductor or by using a replica of nanoholes, other various application are also possible, such as coloring, magnetic storage media, EL devices, electrochromic devices, optical devices, solar cells, and gas sensors. The anodized film is also expected to have further various applications such as quantum effect devices (quantum fine wires, MIM (metal-insulator-metal) devices), molecular sensors using nanoholes as chemical reaction spaces, etc. (Masuda, Solid State Physics, 31, 493 (1996))

Producing nanostructures using semiconductor processing techniques is problematic because of low production yield and high apparatus cost. A simpler technique of producing nanostructures with good reproducibility is therefore desirable. From this point of view, the above-described self-forming techniques, in particular the technique of anodizing aluminum, have the advantage that nanostructures can be easily produced with high controllability. These techniques are also useful to produce large-area nanostructures.

The nanostructures shown in FIG. 3A and 3B have limitations in terms of shapes and applications because nanostructures can be formed only on the surface of an aluminum plate (film). For example, because the melting point of aluminum is as low as 660° C., the nanoholes formed on the surface of aluminum cannot be subjected to a heat treatment at temperatures higher than 660° C. Therefore, to use nanoholes as functional materials in various applications, it is necessary to develop a technique of forming an anodized film on a substrate with a high melting point without destroying its peculiar geometric structure, and also a technique of preventing generation of cracks at high temperatures.

On the other hand, to use the peculiar geometric structure of the anodized film in an electron device, an anodized film must be formed on a semiconductor substrate. In particular, a technique of forming an anodized film on a silicon substrate is important. If it is possible to form an anodized film on a silicon substrate, then it becomes possible to integrate a nanostructure with a silicon semiconductor device such as a diode and a transistor. This allows the nanostructure to be used in wider applications.

A technique of forming an anodized film including nanoholes on a silicon substrate is disclosed in Japanese Patent Laid-Open No. 7-272651. In this technique, an aluminum film is first formed on a silicon substrate, and then the aluminum film is converted into an anodized film. After that, the barrier layer of the anodized film, present at the bottom of the nanoholes, is removed. A metal layer (Au, Pt, Pd, Ni, Ag, Cu) capable of forming an eutectic alloy with silicon is then formed on the exposed parts of the silicon substrate and silicon capillary crystal is grown using the VLS method. In this technique, to produce nanoholes which are completely cut through an anodized film from its surface to a silicon substrate, the barrier layer at the bottom of the nanoholes is removed after anodizing the aluminum film. The removal of the barrier layer may be performed, for example, by means of etching using a chromic acid-based etchant or by means of keeping a silicon substrate, together with an opposite electrode electrically connected to the silicon substrate via an external wire, in a solution still after completion of anodization.

The inventors of the present invention have investigated the above-described technique disclosed in Japanese Patent Laid-Open No. 7-272651. The investigation has revealed that it is very difficult to completely anodize an aluminum film over its entire thickness such that a barrier layer remains at the bottom of all nanoholes 35. That is, the depth of nanoholes varies more or less, and thus it is difficult to produce a structure having a remaining barrier layer with an uniform thickness over a wide area as shown in FIG. 4. During the process of anodizing the aluminum film, the barrier layer is altered or lost in a very short time although the reason is not clear. As a result, the electrolyte comes into contact with the silicon substrate. Thus, oxidation of the silicon substrate and decomposition of the electrolyte occur. Although nanoholes having a remaining barrier layer can be formed in a certain area on the substrate, if the barrier layer is removed, then, as shown in FIG. 5, the diameter of the nanoholes 37 in the parts where the barrier layer is removed will not be uniform in the resulting structure. Furthermore, the shape varies greatly from one nanohole to another. In particular when nanoholes have a large depth, the anodized film tends to have a nonuniform thickness and anodization tends to occur nonuniformly. Thus, it is very difficult to form completely-cut-through nanoholes having an uniform shape with good repeatability.

SUMMARY OF THE INVENTION

The inventors of the present invention have carried out experiments and have determined that when an aluminum film, formed on a substrate having an electrically conductive layer including at least one element selected from the group consisting of Cu, Zn, Au, Pt, Pd, Ni, Fe, Co, and W, is anodized, the anodization current quickly increases at first and then a reduction in the anodization current occurs. Most nanoholes of the anodized film are broken if the anodization is continued further after the anodization current drops. However, if the anodization current is stopped immediately after the start of the anodization current drop, it is possible to obtain an anodized film having nanoholes completely cut through the anodized film from its surface to the electrically conductive surface. However, a further investigation has revealed that a considerable number of nanoholes produced by the above technique do not reach the electrically conductive surface, and the nanoholes do not have sufficient uniformity in shape. Thus, a further improvement of the technique is required.

In view of the above, it is a general object of the present invention to solve the above-described problems. More specifically, it is an object of the present invention to provide a nanostructure having an anodized film including completely-cut-through nanoholes having good uniformity of shape wherein the anodized film is formed on a substrate including at least one material selected from the group consisting of semiconductors, noble metals, and carbon. It is another object of the present invention to provide a device using such a nanostructure.

It is still another object of the present invention to provide a method of producing a nanostructure, in a highly reliable fashion, having an anodized film including completely-cut-through nanoholes having good uniformity of shape wherein the anodized film is formed on a substrate including at least one material selected from the group consisting of semiconductors, noble metals, and carbon. It is still another object of the present invention to provide a high-performance electron emitting device capable of emitting a large amount of electrons.

It is still another object of the present invention to provide a method of efficiently producing a carbon nanotube device which can be advantageously used in a high-performance electron emitting device.

According to a first aspect of the present invention, to achieve the above objects, there is provided a nanostructure comprising a substrate having a surface including at least one material selected from the group consisting of semiconductors, noble metals, Mn, Fe, Co, Ni, Cu and carbon. An anodized film having a nanohole is disposed on the surface of the substrate. The nanohole passes through the anodized film from the surface of the anodized film to the surface of the substrate, and has a first diameter at the surface of the anodized film and a second diameter at the surface of the substrate. The nanohole either has a constriction at a location between the surface of the anodized film and the surface of the substrate with a diameter smaller than the first and second diameters, or else the second diameter is greater than the first diameter.

The present invention has been achieved based on the knowledge obtained through the experiments performed by the inventors of the present invention. That is, when a thin aluminum film is anodized after forming the thin aluminum film on a substrate having a surface including at least one material selected from the group consisting of semiconductors, noble metals, and carbon, a constant anodization current is observed over a certain period of time and then a reduction in the anodization current occurs. If the anodization is performed while monitoring the anodization current and the anodization is terminated when a particular change in current is detected, it is possible to obtain an anodized film including nanoholes having an uniform shape.

The nanoholes obtained by this method have a peculiar shape including a constricted part having a small diameter where the second diameter is greater than the first diameter. If the anodized film including the nanoholes having such a structure is used as an evaporation mask, then it is possible to produce a functional material having an extremely fine pattern. Furthermore, it is also possible to form an extremely fine pattern on the surface of a substrate by etching the surface of the substrate using the anodized film as an etching mask. The nanoholes with the second diameter greater than the first diameter are useful when it is required that an inclusion embedded by means of electro-deposition in the nanoholes be in good electrical contact with the surface of the substrate.

According to another aspect of the present invention, there is provided an electron emitting device comprising the nanostructure of the first aspect of the invention, wherein a carbon nanotube is embedded in the nanohole such that one end of the carbon nanotube is connected to the surface of the substrate. An electrode is disposed such that the electrode and the surface of the substrate face each other, and means for applying a voltage between the surface of the substrate and the electrode is provided.

According to still another aspect of the present invention, there is provided a method of producing a nanostructure comprising an anodized film including nanohole. The anodized film is formed on a substrate having a surface containing at least one material selected from the group consisting of semiconductors, noble metals, Mn, Fe, Co, Ni, Cu and carbon. The nanoholes are cut completely through the anodized film from the surface of the anodized film to the surface of the substrate. The method includes the steps of (i) forming a film containing aluminum on the substrate having a surface containing at least one material selected from the group consisting of semiconductors, noble metals, Mn, Fe, Co, Ni, Cu and carbon, and (ii) anodizing the film containing aluminum. In step (ii), the anodization is conducted while monitoring an anodization current, and the anodization of the film containing aluminum is terminated when a reduction in the anodization current from a steady-state value is detected.

According to still another aspect of the invention, there provided an electrochemical device including a nanostructure produced using any of above-described techniques according to the invention.

According to still another aspect of the present invention, there is provided a method of producing a carbon nanotube device. The method includes the steps of forming a film including aluminum on a substrate having a surface including an n-type semiconductor region anodizing the film including aluminum over the entire thickness thereof so as to form an anodized film having nanoholes, electrodepositing catalytic fine particles on the surface at the bottom of the nanoholes, and growing carbon nanotubes from the catalytic fine particles.

DESCRIPTION OF THE PREFERRED EMBODIMENT

First, the features and advantages of the present invention are described below.

Construction of Nanostructure

Figure 1:
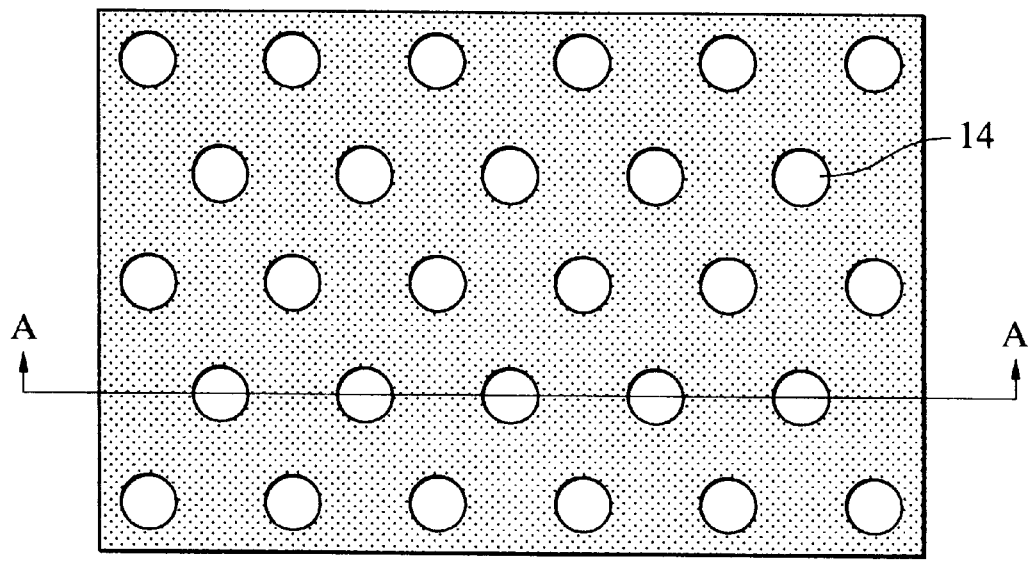
FIG. 1 is a plan view schematically illustrating a nanostructure according to an embodiment of the present invention.
Figure 2:
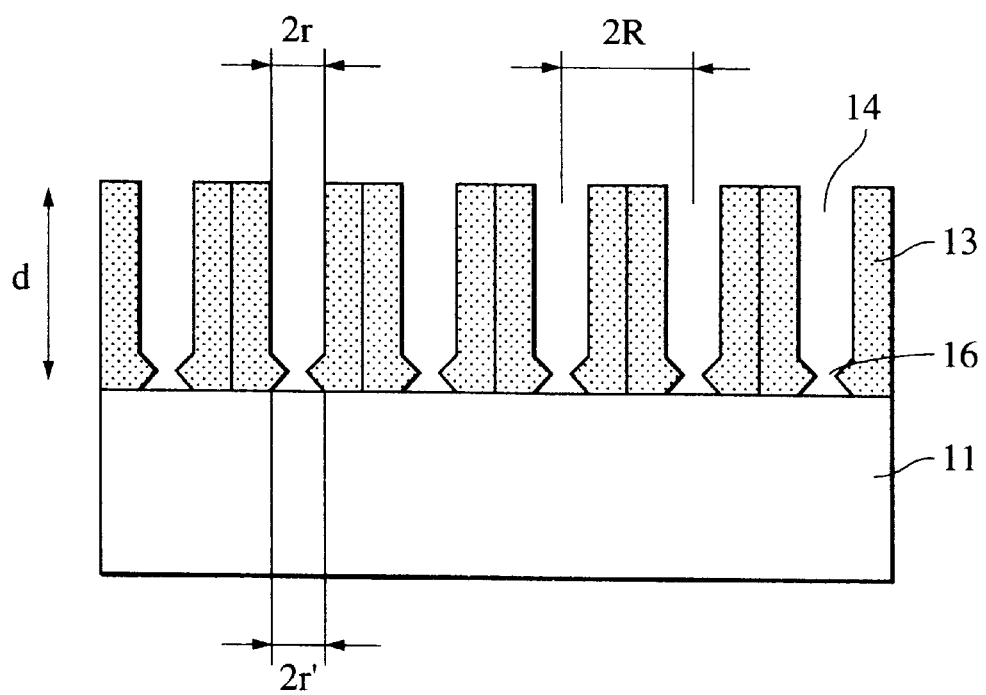
FIG. 2 is a cross-sectional view of FIG. 1 taken along line A—A.

FIG. 1 is a plan view schematically illustrating a nanostructure (nanoholes formed on a semiconductor) according to an embodiment of the present invention. FIG. 2 is a cross-sectional view taken along line A—A of FIG. 1. In FIGS. 1 and 2, reference numeral 11 denotes a semiconductor substrate, 13 denotes an anodized film, and 14 denotes a nanohole (a hole with a very small diameter) formed in the anodized film 13. The chief ingredients of the anodized aluminum film 13 are aluminum and oxygen. The anodized aluminum film 13 includes a great number of cylindrical nanoholes 14. The nanoholes 14 extend in a direction substantially perpendicular to the surface of the semiconductor substrate 11. The nanoholes 14 are parallel to each other and they are located at substantially uniform intervals. The nanoholes 14 are completely cut through the anodized film 13 from the surface of the anodized film 13 to the surface of the semiconductor substrate 11. Each nanohole 14 has a first diameter (2r) at the surface of the anodized film 13 and a second diameter (2r') at the surface of the semiconductor substrate 11. Furthermore, each nanohole 14 has a part (constricted part) 16 with a diameter smaller than the first and second diameters. The nanoholes tend to be formed at triangular lattice points as shown in FIG. 1. The diameter 2r of each nanohole ranges from a few nm to a few hundred nm and the diameter 2R ranges from a few ten nm to a few hundred nm.

Method of Producing Nanoholes

The nanoholes having the structure described above may be produced by anodizing an aluminum film formed on, for example, a semiconductor substrate such that the anodization is terminated when the anodization current drops after the anodization current has reached a steady-state value. To obtain such an anodization current profile having an increase after a first reduction, it is desirable to employ an apparatus and a method which make it possible to uniformly anodize an aluminum film. By employing either the method or the apparatus described above, it is possible to prevent local anodization and pin holes which would occur if the anodization current increased immediately after completion of the anodization without having a reduction.

Figure 6:
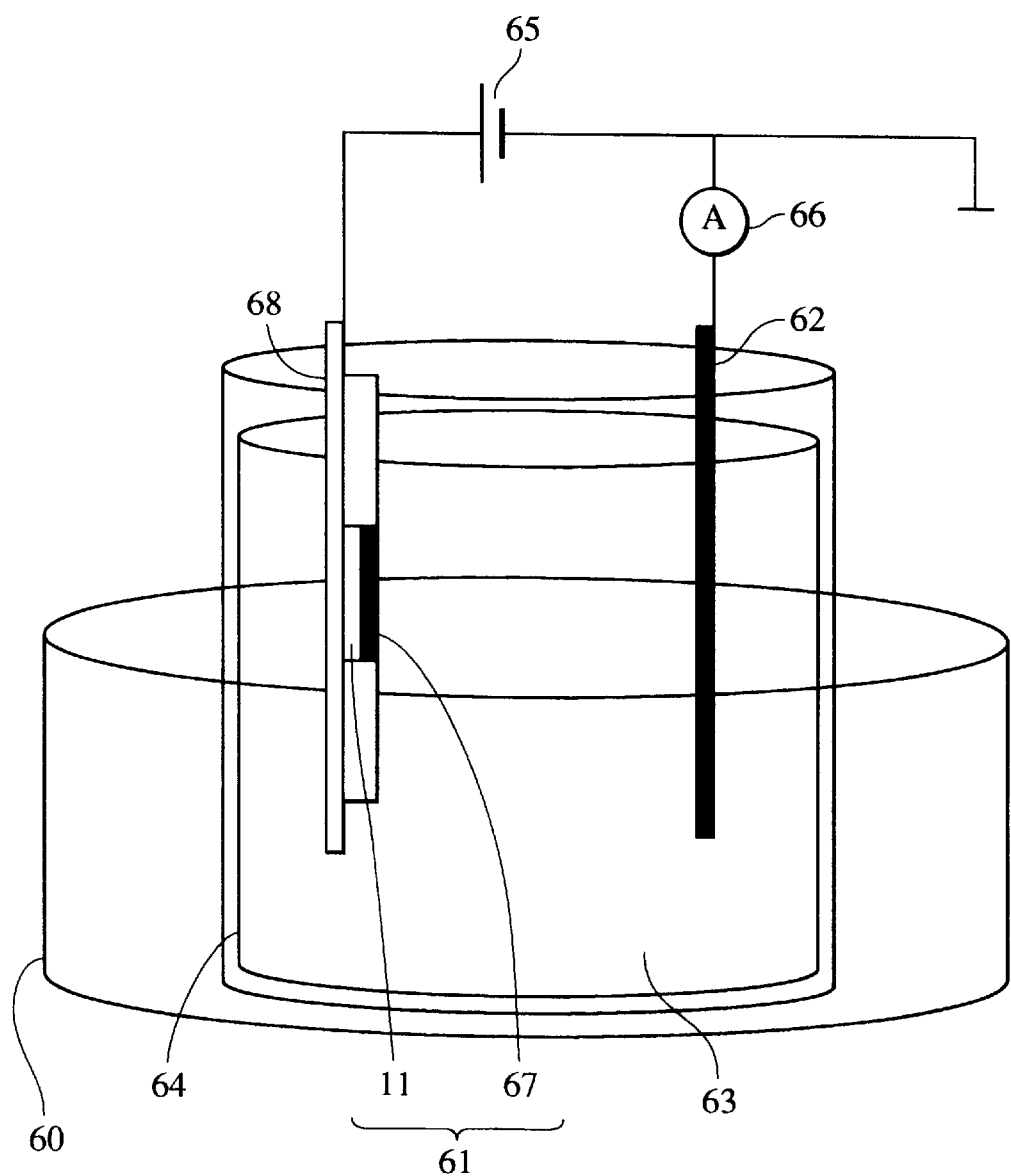
FIG. 6 is a schematic diagram illustrating an anodization apparatus.

FIG. 6 is a schematic diagram illustrating an example of an anodization apparatus. As shown in FIG. 6, the anodization apparatus includes a temperature controlled bath 60, a sample holder 68 on which a sample 61 having an aluminum film 67 formed on the surface of sample 61 is held, an electrolyte 63, a reaction vessel 64, a Pt plate 62 serving as a cathode, a power supply 65 for supplying an anodization voltage, and an ammeter 66 for measuring the anodization current. Although not shown in the figure, the anodization apparatus also includes a computer for measuring the voltage and current and automatically controlling them. The sample 61 (the semiconductor substrate 11 on which the aluminum film is formed) and the cathode 62 are placed in the electrolyte whose temperate is kept constant using the temperature controlled bath. Anodization is performed by applying a voltage between the sample and the cathode from the power supply. A film or a plate consisting chiefly of aluminum can serve as an electrode in the anodization process. However, when this type of film or plate is anodized over its entire thickness, as is the case in the present invention, the aluminum film becomes a poor electrode as the aluminum film is oxidized during the anodization process. As a result, the applied voltage becomes insufficient. This can cause variations in the shape of the nanoholes and hole-to-hole variations. In view of the above, it is desirable that an electrode be provided on a semiconductor substrate so that the aluminum film can be anodized more uniformly during the anodization process. When an electrode is provided on the back surface of the semiconductor substrate, it is desirable that the semiconductor substrate have a sufficiently low resistance to prevent a large voltage drop across the semiconductor substrate. The reduction of the resistance associated with the semiconductor substrate may be achieved, for example, by employing a substrate having a low resistivity, making the semiconductor layer thin, and eliminating a large Schottky barrier.

To uniformly anodize an aluminum film, it is also desirable to minimize the area to be anodized relative to the vessel or the holder. It is also desirable to dispose a substrate having an aluminum film to be anodized and an opposite electrode in an electrolyte such that the effects of convection of the electrolyte on the anodization are minimized. Minimization of stirring of the electrolyte is also desirable. To achieve good uniformity in the anodization of the aluminum film, it is also effective to employ an opposite electrode having a large area compared to the anodization area.

Various types of electrolytes may be employed in the anodization process. They include oxalic acid, phosphoric acid, sulfuric acid, and chromic acid. Sulfuric acid is preferable when the applied voltage is low (about 30 V or lower). When the applied voltage is high (about 60 V or higher), phosphoric acid is preferable. Oxalic acid is preferable when the applied voltage is within a middle range (about 30–60 V).

Current Profile

Semiconductor Surface

Figure 7:
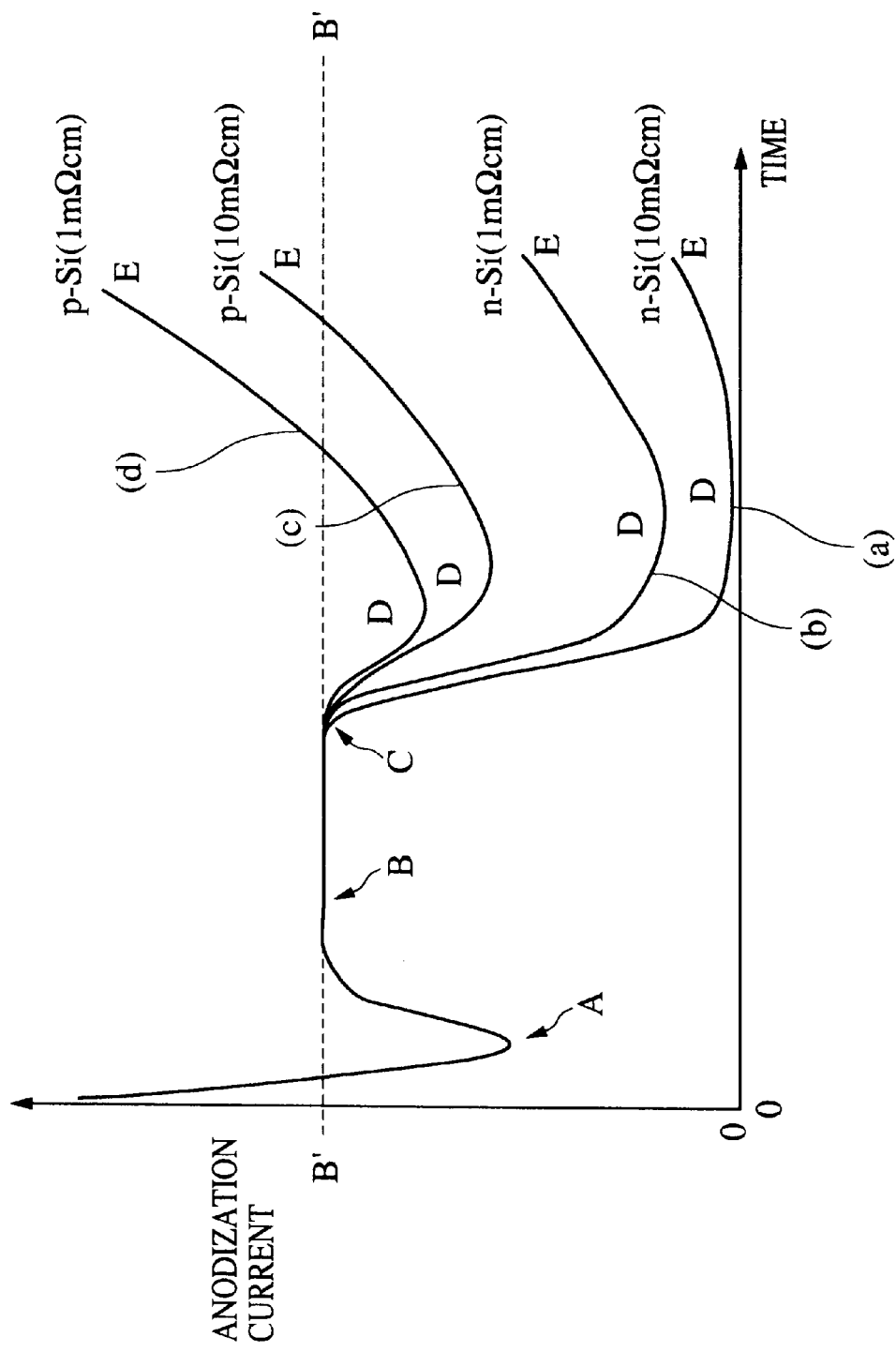
FIG. 7 is a graph illustrating the anodization current as a function of time for aluminum films formed on various substrates.

FIG. 7 illustrates anodization current profiles obtained when aluminum films formed on various substrates having a n-type or p-type silicon surface with various surface resistances are anodized by applying a constant voltage using the apparatus and/or the method described above. Curve (a) shows the change in anodization current for an aluminum film formed on an n-type Si substrate with a surface resistance of 10 mΩcm. Curve (b) shows the anodization current profile for the case where an n-type Si substrate with a surface resistance of 1 mΩcm is employed. Curve (c) shows the anodization current profile for the case where a p-type Si substrate with a surface resistance of 10 mΩcm is employed. Curve (d) shows the anodization current profile for the case where a p-type Si substrate with a surface resistance of 1 mΩcm is employed. In all of the profiles, an abrupt drop (A) in the current occurs at the start of anodization of the surface of the aluminum film and then the current increases up to a steady-state value (B). When the anodization current is held at the steady-state value, the aluminum film is anodized and nanoholes are produced. If the anodization reaches the Si substrate, the oxidation of Al and diffusion of Al ions into the aqueous solution are suppressed. As a result, the current decreases (C, D). If the anodization is continued further, the surface of Si will come in contact with the aqueous solution and thus electrolysis of water and oxidation of Si will occur (E). During such further anodization, the nanoholes will be gradually destroyed. The above problem can be avoided by terminating the anodization when the anodization current starts to drop from the steady-state value. This can be accomplished, for example, by terminating the anodization when the current has decreased by 5% or more of the steady-state value (B). This makes it possible to obtain a nanostructure with an anodized aluminum film having nanoholes uniformly formed and completely cut through the aluminum film from the surface of the aluminum film to the surface of the Si substrate.

In the case of the n-type Si substrate, in particular when the n-type substrate has a large resistance, a large reduction in the anodization current occurs with good reproducibility. However, the reduction in the anodization current is small when a p-type Si substrate is employed. Therefore, when an n-type Si substrate is employed, it is easier to produce nanoholes which are completely cut through to the bottom of the nanoholes. However, precise control is required when a p-type Si substrate is employed. When a p-type Si substrate is employed, the anodization current greatly increases toward a point E after decreasing to a minimum point D. If the anodization is performed for the p-type Si substrate until the anodization current increases to the point E, there is a possibility that nanoholes will be destroyed. Therefore, even when a substrate which exhibits a profile of the type (c) or (d) shown in FIG. 7 is employed and anodization is continued for a long time to produce nanoholes having a structure such as that shown in FIG. 10(*a*), it is desirable to terminate the anodization before the anodization current increases to a value equal to the steady-state value B'.

The nanoholes formed in the anodized film by the above-described method have the feature that the nanoholes are completely cut through the anodized film from its surface to the surface of the substrate and the nanoholes have good linearity over the entire length. When the bottom of the nanoholes are cut through, a constricted structure 16 is formed because of movement of Al ions from the surface of the semiconductor.

That is, the nanostructure according to the present embodiment has nanoholes having excellent linearity and excellent uniformity of the diameter over the entire length to the bottom of the nanoholes, compared with the nanoholes produced by removing the barrier layer after completion of the anodization process according to the conventional technique. Furthermore, the hole-to-hole variation in the shape at the bottom of the nanoholes produced according to the present embodiment is small. In particular, when nanoholes are produced into a periodic honey-comb form, the uniformity in terms of the shape of nanoholes such as the nanohole diameter and the uniformity of cut-through portions at the bottom of the nanoholes are improved. Nanoholes in a periodic form may be produced, for example, by producing recessed portions on the surface of aluminum at proper intervals prior to the anodization, so that the recessed portions serve as starting points at which the formation of the nanoholes starts.

Size of Nanoholes

The hole-to-hole distance and the diameter of the nanoholes may be controlled to a certain degree by controlling the process conditions including the concentration and the temperature of the electrolyte used in the anodization, the method of applying an anodization voltage, the value of the applied voltage, the anodization time, and the condition of the pore widening process performed after the anodization.

Anodized Film

Returning now to FIG. 2, the thickness of the anodized film 13 and the depth of nanoholes 14 can be controlled by adjusting the thickness of the film including aluminum. According to this technique, the depth of nanoholes can be controlled, for example, in the range of 10 nm to 100 $\mu$m. In the conventional techniques, the depth of nanoholes is generally controlled by the anodization time. Instead, in the present invention, the depth of nanoholes is controlled by the thickness of the film including aluminum as a chief ingredient so as to obtain an anodized aluminum film having nanoholes with uniform depths.

Semiconductor Substrate

Various substrates may be employed as the semiconductor substrates 11. They include single crystals and thin films (Si, Ge, GaAs, InP, SiC, diamond), polycrystals, amorphous Si, and Si compound materials. Furthermore, an arbitrary substrate on which a film including Si or the like as a chief ingredient is formed by a proper method (such as resistance heating evaporation, EB evaporation, sputtering, CVD) may also be employed.

Metal Substrate

Figure 8:
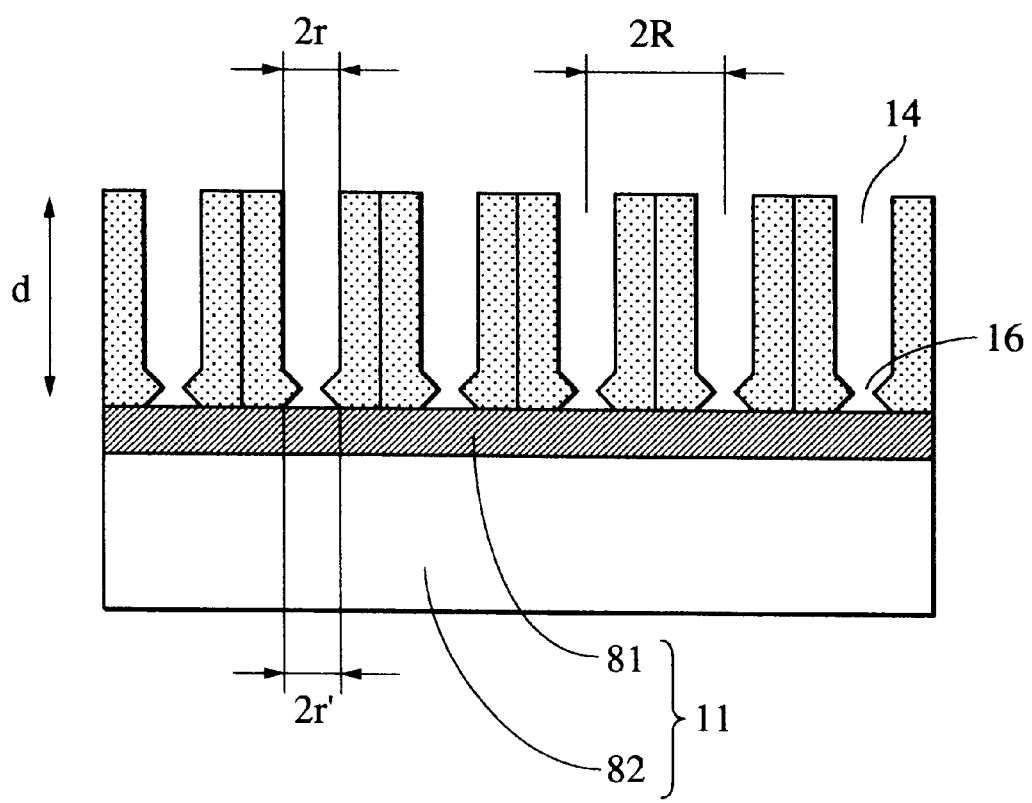
FIG. 8 is a cross-sectional view schematically illustrating a nanostructure according to another embodiment of the present invention.

The substrate 11 serving as an underlying material, on which an Al film to be anodized is formed, is not limited to semiconductors. For example, substrates having a conductive surface including a noble metal, Mn, Fe, Co, Ni, Cu or carbon may also be employed to form, by means of the above-described method, a nanostructure including nanoholes with uniform shapes as shown in FIG. 8. Specific examples of noble metals include Ag, Au, Pt, Pd, Ir, Rh, Os, and Ru.

Graphite, glassy carbon, amorphous carbon, etc., may be employed when carbon is used.

As for the substrate 11 having the conductive surface 81 including a noble metal, Mn, Fe, Co, Ni, Cu or carbon, a substrate made of noble metal, Mn, Fe, Co, Ni, Cu or carbon may be employed. Furthermore, a substrate made of a proper substrate material 82 on which a conductive film 81 including a noble metal, Mn, Fe, Co, Ni, Cu or carbon is formed by a proper method (such as resistance heating evaporation, EB evaporation, sputtering, CVD) as shown in FIG. 8 may also be employed. When a substrate having a surface including a noble metal or carbon is used, it is sometimes more difficult to uniformly anodize the aluminum film formed on such a surface than to uniformly anodize the aluminum film formed on a semiconductor surface. To avoid the above difficulty, it is desirable to employ at least two uniform-anodization methods selected from those described above.

Figure 9:
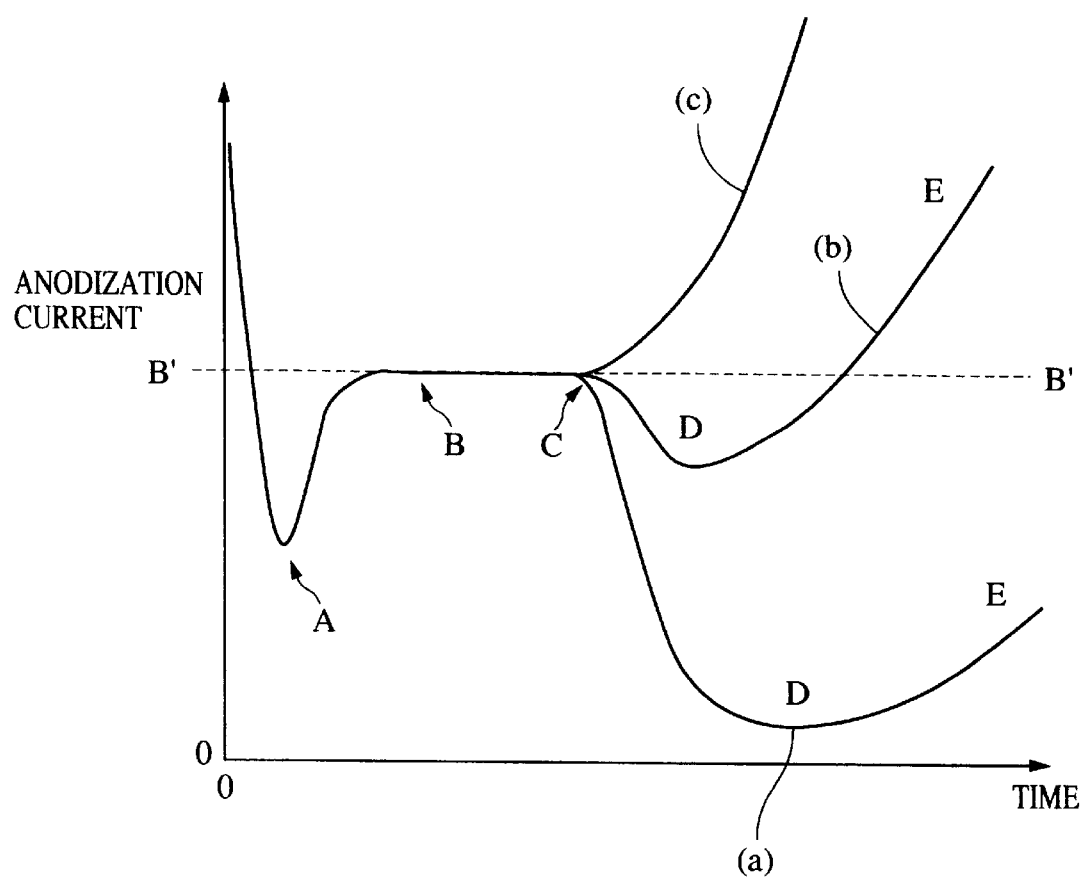
FIG. 9 is a graph illustrating the anodization current as a function of time for aluminum films formed on various substrates.

Anodization Current Profile in the Anodization of Al Film on the Surface of Noble Metal FIG. 9 illustrates the anodization current profile for the case where an aluminum film formed on a quartz substrate with a Ir film or a Pt film is anodized in an electrolyte such as oxalic acid by applying a constant voltage via an electrode formed on an underlying layer. The anodization current quickly decreases at the start of anodization of the surface of the aluminum film. However, when the formation of nanoholes is started, the anodization current gradually increases to a steady-state value (point B). Herein, to precisely measure the anodization current, it is desirable that the underlying layer do not come in contact with the electrolyte. When the anodization has reached the surface of the noble metal, oxidization of the aluminum and diffusion of aluminum ions into the electrolyte are suppressed and thus the anodization current decreases (points C and D). If the anodization is continued further, then the surface of the underlying material will come into contact with the aqueous solution and electrolysis of water will occur (point E). The electrolysis causes the nanoholes to be gradually broken. However, if the anodization is terminated at a proper time after the anodization current has dropped to the minimum point D from the steady-state value B before the anodization current increases to point E, it is possible to obtain a nanostructure having an anodized aluminum film including uniformly formed nanoholes completely cut through the anodized film to the surface of the noble metal substrate. In particular, if the anodization is terminated as soon as the anodization current decreases by 5% or greater, the bottoms of nanoholes will be cut through. In the case of noble metal (such as Ir) capable of having a stable oxide, a great reduction in current occurs. However, the increase in the current after passing the minimum point D is rather small. In this case, the nanoholes will not be broken if anodization is continued until point E (curve (a)). On the other hand, in the case of Pt or similar noble metal, the current increases greatly toward point E after dropping to the minimum point D. In this case, if the anodization is continued further until reaching point E, the nanoholes are often broken (curve (b)). Therefore, when a substrate whose surface is made of a material which exhibits an anodization current profile similar to curve (b) is used, it is desirable to terminate the anodization before the anodization current returns to the steady-state value B' after dropping to the minimum point D.

When a substrate having a surface including silicon (hereafter referred to as a silicon surface) is employed, the silicon surface is sometimes partially oxidized at the interface between the nanoholes and the silicon surface. In this case, the nanoholes have silicon oxide at their bottom. Furthermore, in some cases, depending on the type of the silicon surface and the anodization conditions, the silicon oxide is formed into a porous structure including vacancies with a size of a few nm.

The nanostructure having such an oxide layer at the bottom of nanoholes may be used for example in a chemical sensor. More specifically, such a nanostructure may be used as a gate insulating layer in a MOSFET type chemical sensor. In the chemical sensor of such a type, the nanoholes located on the insulating layer can serve as a filter. That is, sensing can be performed while rejecting molecules, impurities, and biomolecules having sizes greater than the diameter of the nanoholes.

In the case where the nanoholes are filled with metal or semiconductor by means of electro-deposition after the anodization, the substrate serves as an electrode in the electro-deposition process and thus it is desirable to employ a substrate having a surface formed of a low-resistance semiconductor so as to achieve good controllability in the electro-deposition process. Such a nanostructure according to the present embodiment can have good electric contact between the surface of the substrate and the inclusion in the nanoholes.

When metal such as Co, Cu, or Ni is electro-deposited, the metal element produces cations in an electro-deposition solution. Therefore, it is required to apply a negative voltage to the semiconductor at the bottom of the nanoholes where the metal is to be electro-deposited. Conversely, when negative ions are electro-deposited or when oxidation is required at the same time, it is required to apply a positive voltage. Herein, the "electro-deposition" includes precipitation of a hydroxide via electrolytic oxidation. In this case, the following reaction occurs at the surface of an anode:

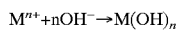

$M^{n+} + nOH^- \rightarrow M(OH)_n$ where M is a metal ion.

Herein, if there is another ion, the ion is incorporated into the precipitate. In this case, the following reaction occurs.

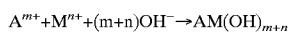

$A^{m+} + M^{n+} + (m+n)OH^- \rightarrow AM(OH)_{m+n}$ wherein AM is a metal ion.

In the present invention, formation of an inclusion by means of electrophoresis is also called electro-deposition. For example, because DNA (deoxyribonucleic acid) is negatively charged in an aqueous solution, DNA can be embedded in the nanoholes by applying a positive voltage to the semiconductor.

Instead of electro-deposition, another proper technique such as osmosis from above the nanoholes or a film formation technique such as CVD may also be employed to produce an inclusion in the nanoholes. The electro-deposition technique is also employed to fill the nanoholes with not only metal but also another material such as a semiconductor or an oxide.

For example, after producing completely-cut-through nanoholes on silicon by means of anodization, if fine Au particles are electro-deposited and silicon is then grown in a gas atmosphere such as disilane, it is possible to grow silicon only in the region where Au has been electro-deposited such that projections of silicon extending outward from the inside of the nanoholes are formed.

Inclusion in Nanoholes

Magnetic Inclusion

Figure 14:
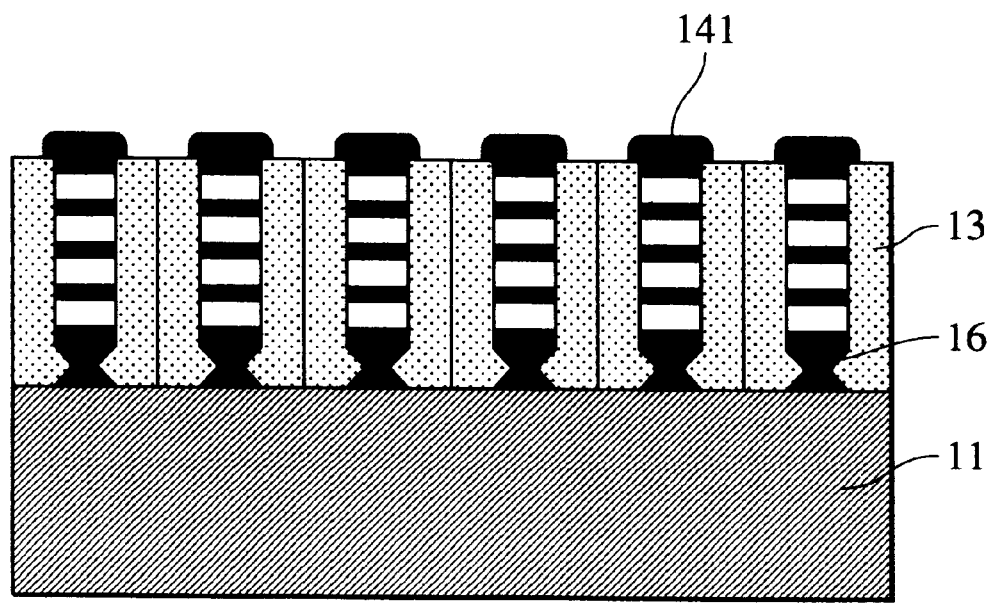
FIG. 14 is a cross-sectional view schematically illustrating a nanostructure obtained by embedding a metal multilayer in the nanoholes of the nanostructure shown in FIG. 2.

In the case where a magnetic material is employed as the inclusion, the nanostructure may be used as a magnetic medium which can be advantageously used as a vertical magnetic film. If the magnetic inclusion is regarded as a magnetic fine wire, it is possible to use the nanostructure in a quantum effect device. Furthermore, if Co and Cu are electro-deposited inside the nanoholes into the form of a multilayer inclusion 141 as shown in FIG. 14, it is possible to produce a GMR (giant magnetoresistive) device capable of responding to a magnetic field.

Phosphor

If an inclusion of a phosphor or a fluophor is formed, it is possible to realize a light emitting device. Furthermore, a nanostructure having such an inclusion may be used as a wavelength conversion layer. A nanostructure having nanoholes in which a dielectric other than aluminum oxide is embedded as the inclusion is useful in applications of photonic devices.

If a semiconductor of a type different from that of the semiconductor used as the substrate is embedded as the inclusion in the nanoholes, it is possible to realize a device such as a photosensitive device and a diode.

As used herein, the term "inclusion" is used to describe not only a substance embedded in nanoholes but also a substance extending outward from the inside of the nanoholes.

Figure 10A:
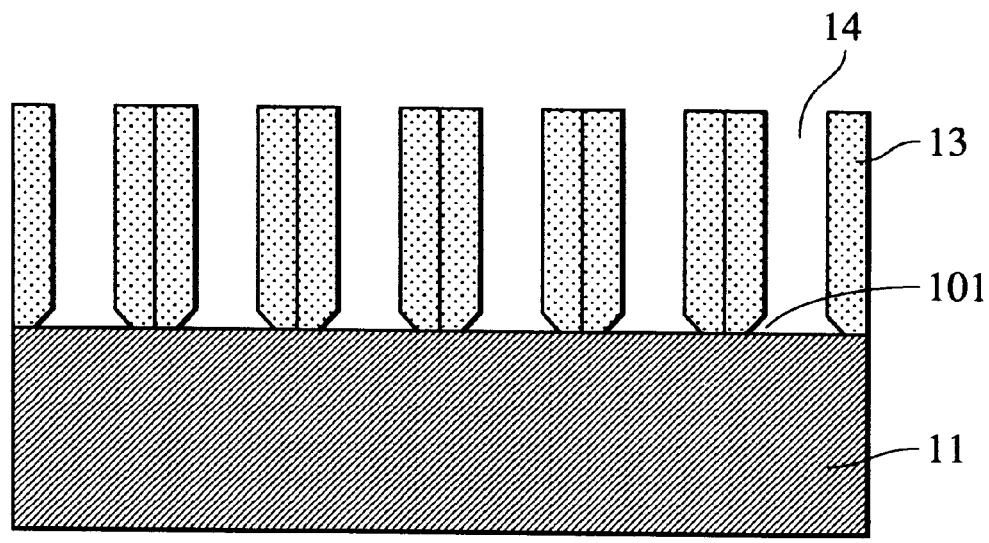
FIGS. 10A and 10B are cross-sectional views schematically illustrating a nanostructure according to another embodiment of the present invention, formed on, respectively, a semiconductor substrate and on a conductive film on a substrate.
Figure 10B:
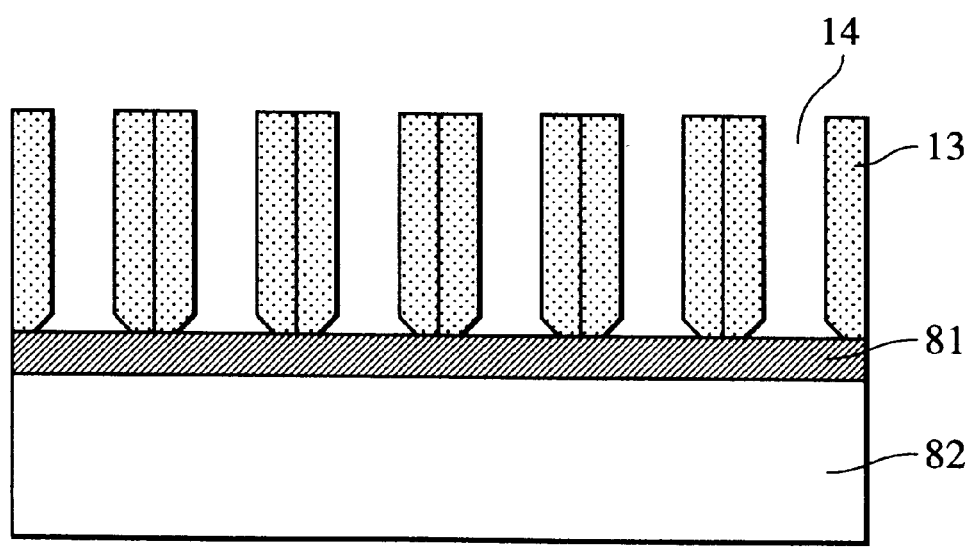
Figure 11:
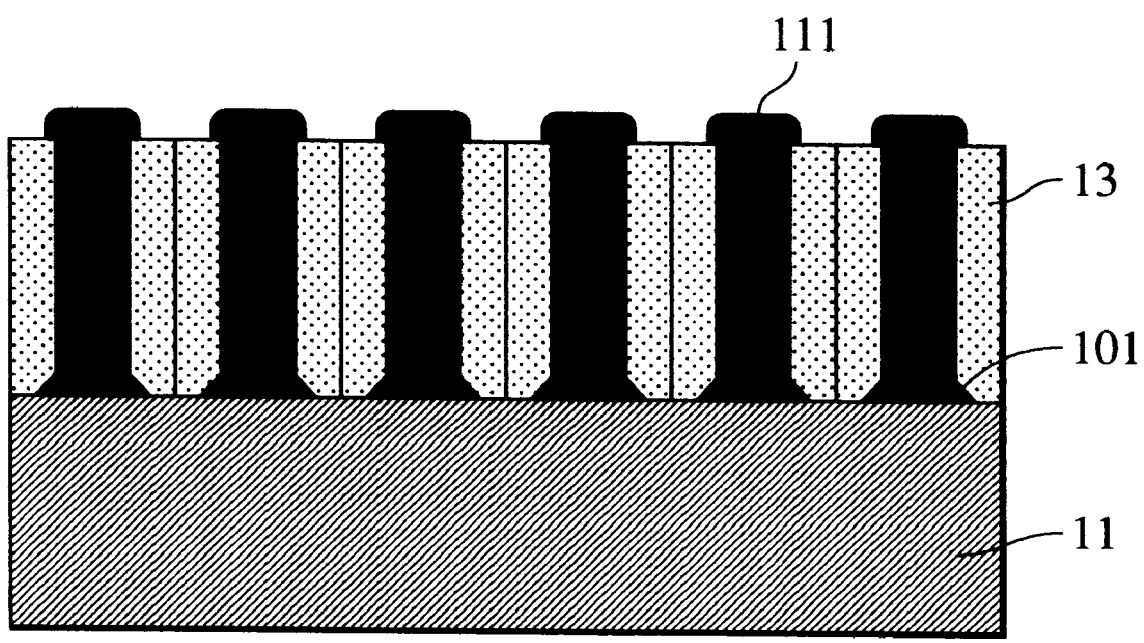
FIG. 11 is a cross-sectional view schematically illustrating a nanostructure obtained by embedding a filler in the nanoholes of the nanostructure shown in FIG. 10A.

In cases where the anodization is not terminated immediately after the reduction in the anodization current from the steady-state value in FIG. 7 or 9, and continues until a proper point between D and E in the profiles shown in FIG. 7 or FIG. 9, then the resultant nanoholes can have an expanded portion 101, as shown in FIG. 10A. In this case, the diameter (2r') at the surface of the substrate 11 becomes greater than the diameter (2r) at the surface of the anodized film 13. If the nanoholes having such a structure are filled with an inclusion, the inclusion can be electrically connected to the surface of the substrate in a highly-reliable fashion, as shown in FIG. 11.

Application of the Nanostructure (Anodized Film) to a Mask

Figure 12A:
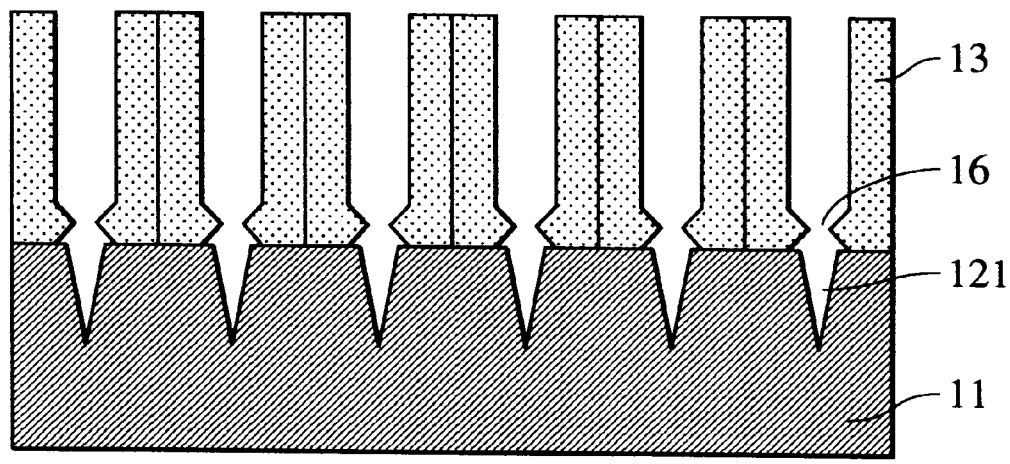
FIG. 12A illustrates a structure obtained by etching a substrate using the anodized film shown in FIG. 2 as an etching mask.
Figure 12B:
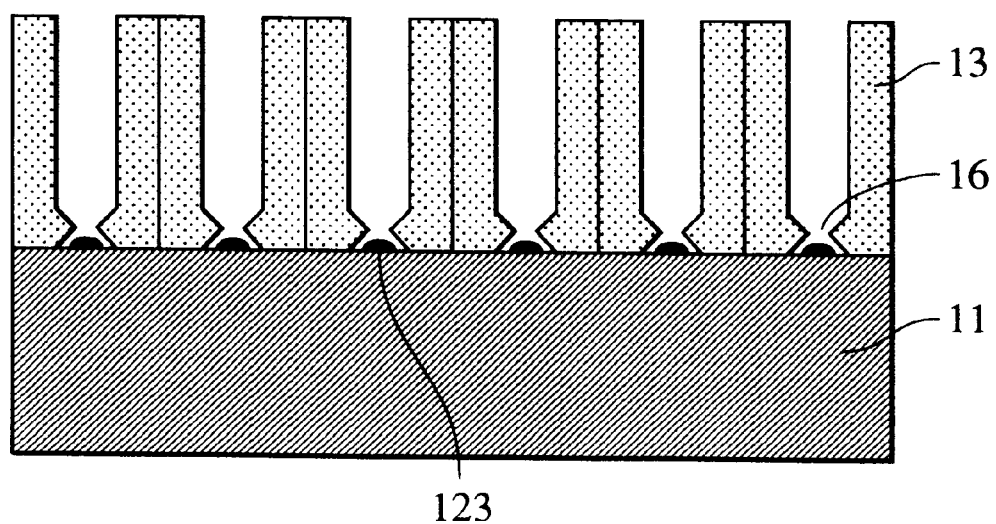
FIG. 12B illustrates a structure obtained by evaporating gold on the surface of a substrate using the anodized film shown in FIG. 2 as an evaporation mask.

The anodized film having the nanostructure produced using the above-described technique may be used in a microfabrication process on the surface of a substrate. Furthermore, the nanostructure may also be used as a mold to produce a fine structure. For example, if an underlying silicon substrate is etched using an anodized film 13 having nanoholes whose bottom is cut through as a mask, it is possible to form small recessed portions on the surface of the silicon substrate. It is also possible to form small Au areas on the surface of the silicon substrate by evaporating Au from above using the anodized aluminum film having nanoholes with a cut-through bottom as a mask, as shown in FIG. 12B. When the nanostructure is used as a mask, the constricted structure in the nanoholes causes the openings of the mask to become smaller. Thus, the nanostructure with the constricted structure is particularly useful to form a fine pattern 123 on the surface of a substrate. In the case of nanoholes having the constricted structure, constricted parts have a reversely tapered shape. Such a nanostructure is useful in the lift-off process. The nanostructure having such a structure is also useful to achieve electric isolation between the upper portion of the nanoholes and the lower portion of the nanoholes.

The nanohole diameter of the various types of nanostructures described above may be expanded as required by immersing the nanostructures in for example an acid solution (such as phosphoric acid). Herein, this process is called pore widening. By controlling the concentration of acid, the processing time, and the temperature, it is possible to realize a nanostructure having a desired nanohole diameter.

Metal may be electro-deposited inside the nanoholes by immersing a nanohole substrate in a solution including metal ions to be electro-deposited and applying a negative voltage to the substrate of silicon or the like. As for the solution described above, for example, an aqueous solution of cobalt sulfate may be employed. In the case where there is a silicon oxide layer on the surface, it is desirable to remove the silicon oxide layer form the surface by immersing the nanostructure in hydrofluoric acid, buffered hydrofluoric acid, or alkaline aqueous solution such as an aqueous solution of potassium hydroxide, before the electro-deposition process. To sufficiently generate nuclei in the electro-deposition process, it is effective to apply an AC voltage. When there is an oxide of noble metal on the surface, if annealing is performed in a reducing atmosphere, the high resistance part on the surface can be converted into a low resistance part. Furthermore, in some cases, it is desirable to polish the surface to achieve a flat nanohole surface.

Patterning

When the nanostructure according to the embodiment of the invention is used in an electronic device or a photonic device, a technique of imparting a particular function only to a particular nanohole or a technique of imparting different functions to nanoholes located in different regions will be important. The imparting a particular function selectively to a particular nanohole may be accomplished, for example, by the method illustrated in FIG. 21A. That is, a p-type region 231 is first formed selectively on an n-type silicon substrate 11. More specifically, using a widely used semiconductor technique, ion implantation is performed through an implantation mask such as a SiN layer and then annealing for recrystallization is performed thereby forming a low-resistant region in a low-concentration substrate with a high resistivity or forming a p-type region 231 in an n-type substrate.

Figure 21A:
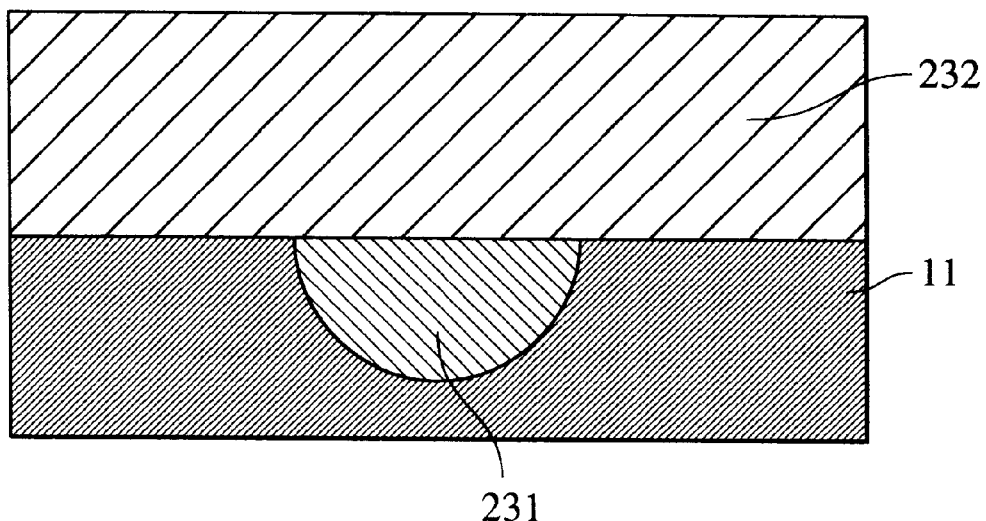
FIGS. 21A, 21B, 21C, and 21D illustrate a process of producing a nanostructure including nanoholes such that nanoholes located in a particular area have a particular function.
Figure 21B:
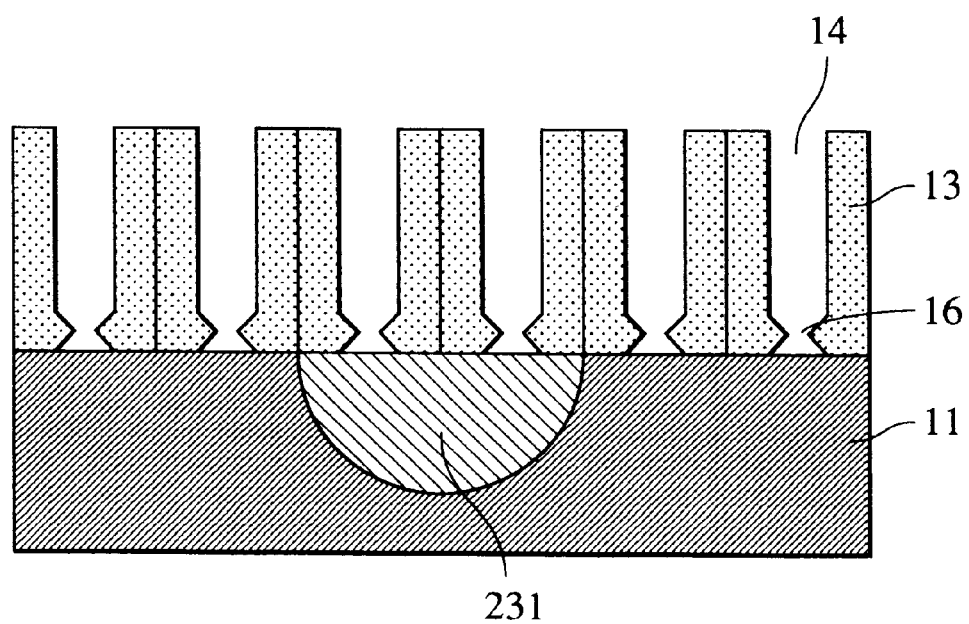
Figure 21C:
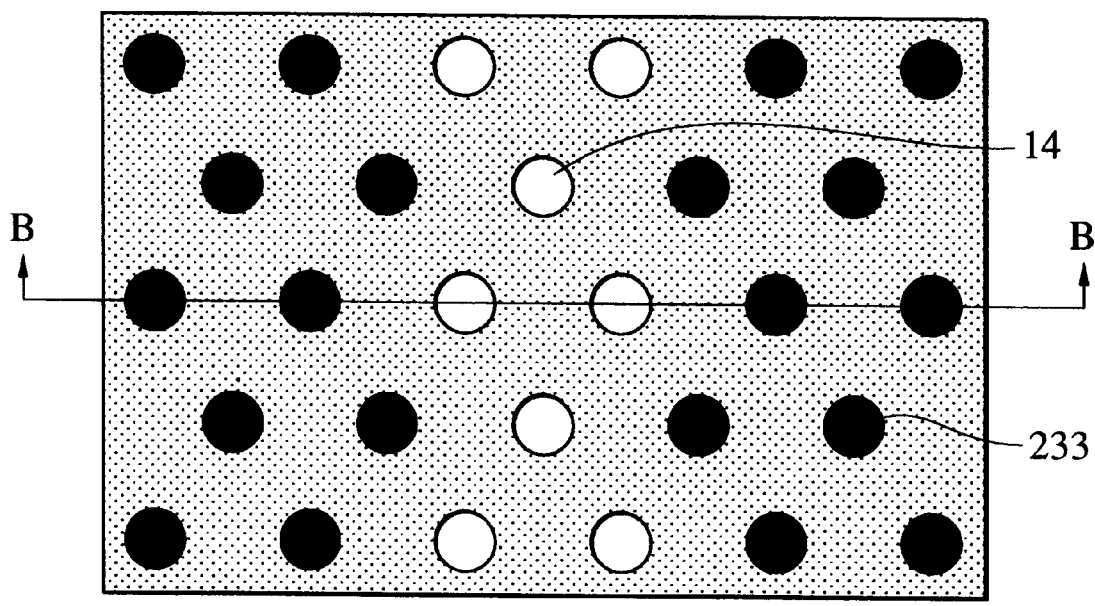

After that, as shown in FIG. 21A, an aluminum film 232 is formed on the surface of the substrate 11 on which the pattern of p-type region 231 has been formed. The aluminum film 232 is then anodized using the method described earlier. If the anodization is terminated at a point near D of the anodization current profile shown in FIG. 7 before the anodization current exceeds the steady-state current B, it is possible to obtain nanoholes that are completely cut through the anodized film from the surface of the anodized film to the surface of the silicon substrate regardless of whether nanoholes are located on the n-type silicon region or the p-type silicon region, as shown in FIG. 21B. The investigation performed by the inventors of the present invention has revealed that when the underlying layer is made of a semiconductor, the deposition rate of electro-deposition in nanoholes greatly varies depending on the carrier type and the carrier concentration (resistivity) of the substrate at the bottom of the nanoholes. In the case where metal such as Co, Cu, or Ni is electro-deposited inside the nanoholes, because the metal element becomes cations in an electro-deposition solution, it is required to apply a negative voltage to the semiconductor at the bottom of the nanoholes where the metal is to be electro-deposited. In this case, it is easier to perform electro-deposition on an n-type semiconductor. That is, for example Co is preferentially electro-deposited inside the nanoholes located on the n-type region, as shown in FIG. 21C and also in FIG. 21D which is a cross-sectional view of FIG. 21C taken along line B—B. Thus, a filler of Co 233 is formed inside the nanoholes. In the above process, if the resistivity of the p-type region is increased, it becomes possible to obtain a greater difference in the electro-deposition rate.

If a particular region having a pattern corresponding to a comb-shaped electrode or corresponding to a pattern of a semiconductor transistor is formed on the surface of a substrate using the above-described technique, it is possible to realize various nanostructure devices such as an electrochemical sensor with a nanostructure.

Figure 22A:
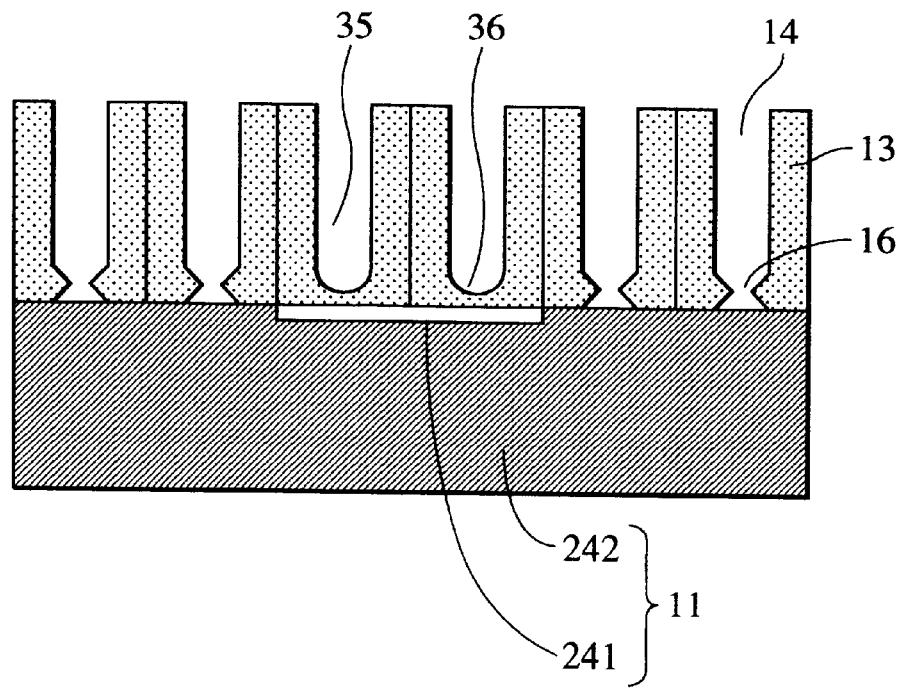
FIG. 22A is a cross-sectional view schematically illustrating a nanostructure produced using an electrically conductive substrate on which a patterned electric insulating layer is formed.
Figure 22B:
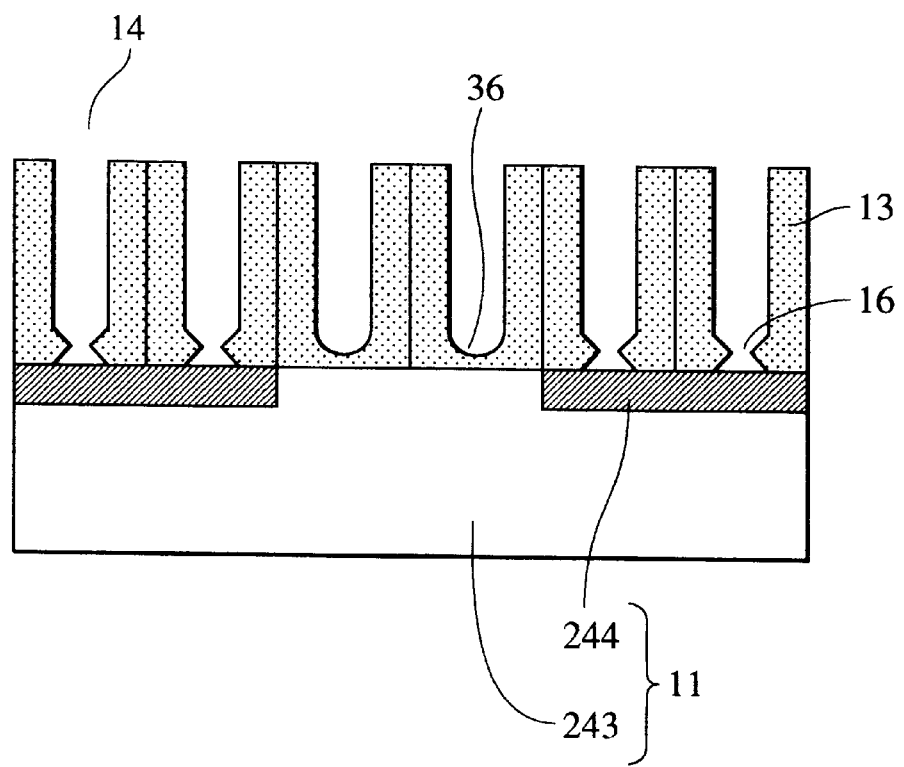
FIG. 22B is a cross-sectional view schematically illustrating a nanostructure produced using an electrically insulating substrate on which a patterned electrically conductive layer is formed.
Figure 23A:
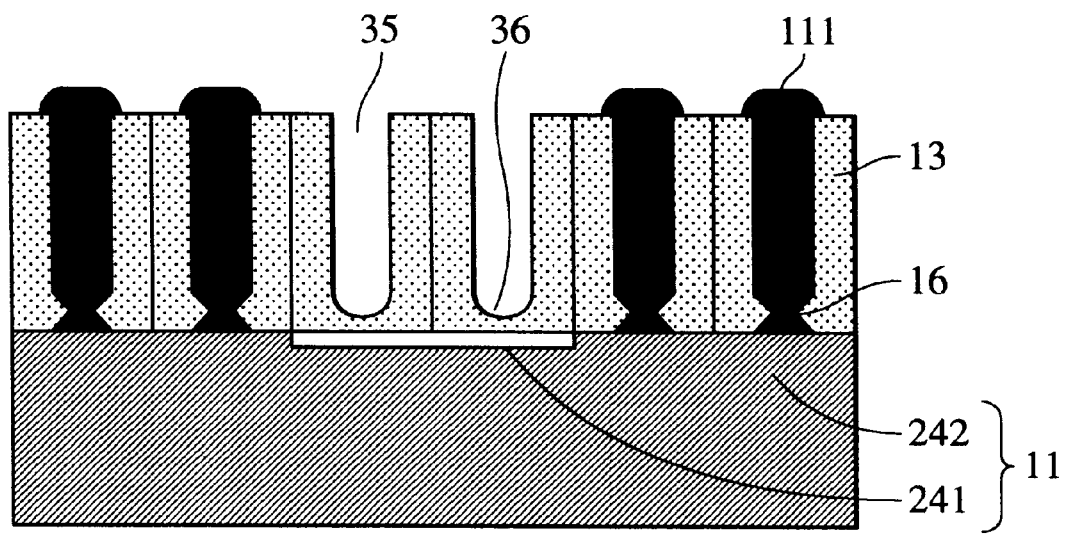
FIG. 23A is a cross-sectional view schematically illustrating a nanostructure obtained by embedding a filler in particular nanoholes of the nanostructure shown in FIG. 22A.
Figure 23B:
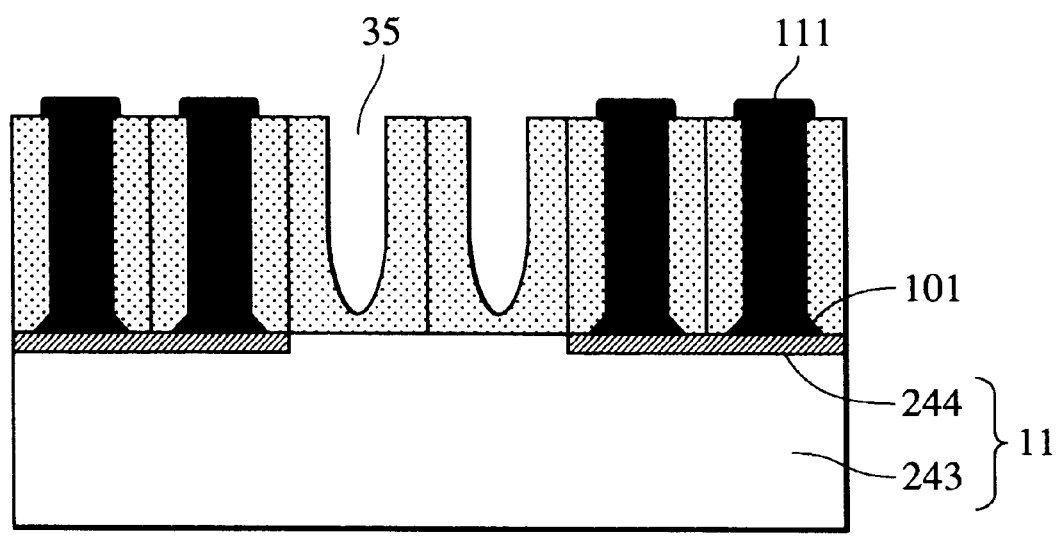
FIG. 23B is a cross-sectional view schematically illustrating a nanostructure obtained by embedding a filler in particular nanoholes of the nanostructure shown in FIG. 22B.

The formation of a pattern on the surface of a substrate is not limited to the selective formation of a p-type region. For example, as shown in FIG. 22A, an insulating layer 241 may be formed selectively in a particular region on an electrically conductive substrate 242 including a semiconductor, a noble metal, or carbon. Alternatively, as shown in FIG. 22B, an electrically conductive layer 244 including a noble metal or carbon may be formed selectively in a particular region on an electrically insulating substrate 243, thereby making it possible to selectively perform electro-deposition in nanoholes located in a particular region as shown in FIG. 23A or 23B.

Figure 25:
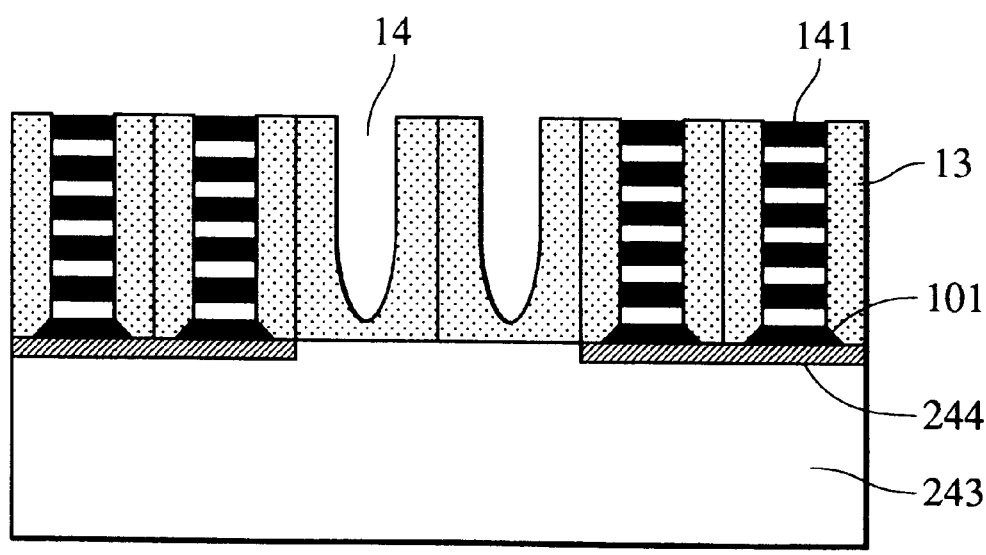
FIG. 25 is a cross-sectional view schematically illustrating a nanostructure obtained by embedding a metal multilayer in the nanoholes formed on the electrically conductive layer of the nanostructure shown in FIG. 22B.

The nanostructure with the electro-deposited pattern produced using the above-described technique may be used in various devices depending on the type of electro-deposited material. In the case where a magnetic material is employed as the inclusion, the nanostructure may be used as a magnetic medium which can be advantageously used as a vertical magnetic film. If the magnetic inclusion is regarded as a magnetic fine wire, it is possible to use the nanostructure in a quantum effect device. Furthermore, if Co and Cu are electro-deposited inside the nanoholes into the form of a multilayer as shown in FIG. 25, it is possible to produce a patterned GMR device capable of responding to a magnetic field. If an inclusion of a phosphor or a fluophor is formed, it is possible to realize a light emitting device. Furthermore, a nanostructure having such an inclusion may be used as a wavelength conversion layer. A nanostructure having nanoholes in which a dielectric other than aluminum oxide is embedded as the inclusion is useful in applications of photonic devices. In this case, the technique of selectively embedding an inclusion into nanoholes located in a particular region defined by means of patterning is particularly important.

Figure 24:
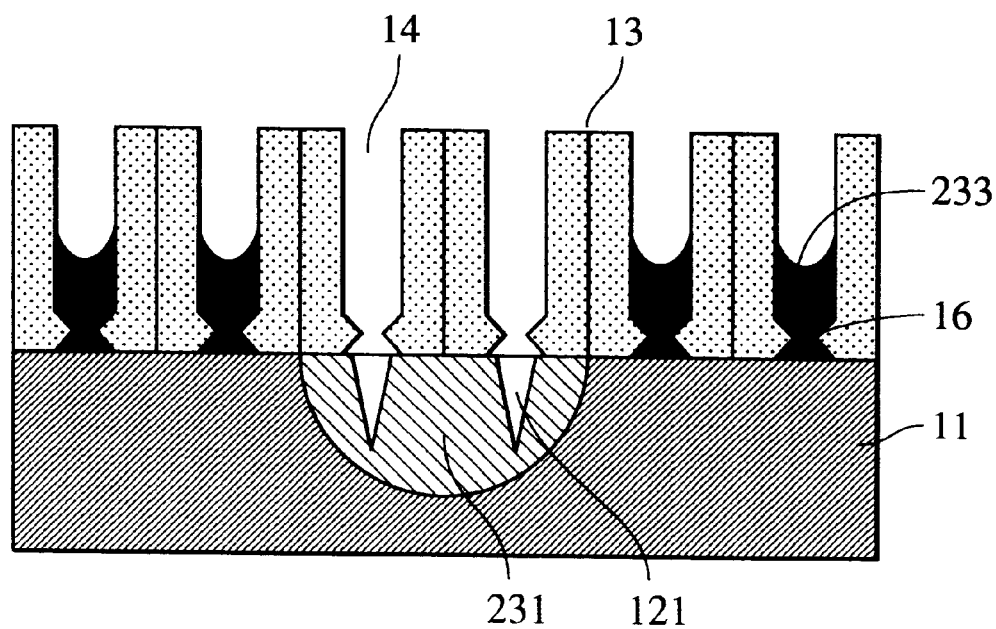
FIG. 24 is a schematic diagram illustrating a structure obtained by etching the surface of a substrate using the anodized film with the nanostructure shown in FIG. 21D as a mask.

The nanostructure with nanoholes formed in the anodized film according to the present invention may also be used as a mask or a mold. For example, if an inclusion 233 is selectively embedded only in a patterned region on an underlying material as shown in FIG. 24, it becomes possible to selectively etch the underlying material 231 only in the region where no inclusion is embedded. It is also possible to form a fine Au pattern on the surface of a silicon substrate by evaporating Au from above using an anodized aluminum film having nanoholes with a cut-through bottom as a mask. When the nanostructure is used as a mask, the constricted structure in the nanoholes causes the openings of the mask to become smaller. Thus, the nanostructure with the constricted structure is particularly useful to form a fine pattern on the surface of a substrate. In the case of nanoholes having the constricted structure, constricted parts have a reversely tapered shape. Such a nanostructure is useful in the lift-off process. The nanostructure having such a structure is also useful to achieve electric isolation between the upper portion of the nanoholes and the lower portion of the nanoholes.

Specific Embodiments

The present invention is described in further detail below with reference to specific embodiments. It should be understood, however, that the invention is not limited to those embodiments shown here.

First Embodiment

The effects of the anodization time in the process of producing nanoholes by anodizing an aluminum film on a silicon substrate were investigated. The result is described below. In this embodiment, mirror polished single-crystal Si substrates of n-type and p-type having a resistivity of $10^{-2}$ $\Omega$cm were used as the Si substrate wherein phosphorus-doped silicon substrates were employed as the n-type substrates and boron-doped silicon substrates were employed as the p-type substrates.

a) Formation of an Al film on the Si substrates

An aluminum film with a thickness of 300 nm was formed by means of RF sputtering on the surface of three Si substrates of each type (six wafers in total). The RF sputtering process was performed using Ar gas at 30 mTorr with RF power of 500 W.

b) Anodization

Anodization was performed using the anodization apparatus shown in FIG. 6.

In the present embodiment, a 0.3 M aqueous solution of oxalic acid was used as the electrolyte, and the solution was kept at 17° C. using a temperature controlled bath. A DC voltage of 40 V was applied as the anodization voltage. The DC voltage was applied via an electrode formed over the entire area of the back surface of the silicon substrate so as to achieve uniform anodization. The anodization current was monitored during the anodization process to detect a change in current indicating the completion of anodization over the entire thickness of the aluminum film from its surface to the surface of the silicon substrate. The anodization was terminated at point C, D, or E shown in FIG. 7. As can be seen from FIG. 7, less reductions in current were observed for p-type substrates while greater reductions in current were observed for n-type substrates. In FIG. 7, C denotes a point at which the current started to decrease (the amount of reduction at point C is less than 5%), D denotes a minimum point, and E denotes a point where the anodization current has an increased value after the drop to the minimum point. However, for those samples using a p-type silicon substrate, the anodization was terminated before the anodization current returned to the steady-state value B'. After the anodization process, the samples were cleaned with purified water and isopropyl alcohol.

c) Pore Widening Process

The diameters of nanoholes were expanded by immersing the samples in 5 wt % phosphoric acid for 20 to 45 min after the anodization process.

Evaluation (Structure Observation)

The surface and cross section of samples were observed with an FE-SEM (Field Emission-Scanning Electron Microscope).

Result

In those sample which were obtained by terminating the anodization at point C, although some nanoholes were completely cut through to the surface of the silicon substrate, a considerable number of nanoholes had a barrier layer remaining at the bottom. That is, all nanoholes were not fully cut through. When the anodization was terminated at point D, all nanoholes were formed in a completely cut-through structure reaching the surface of the silicon substrate regardless of the silicon substrate was of p type or n type, and a constricted structure 16 such as that shown in FIG. 2 was observed near the bottom of each nanohole 14. On the other hand, in those samples which were obtained by terminating the anodization at point E, all nanoholes were formed in a completely cut-through structure reaching the surface of the silicon substrate, and an expanded structure 101 such as that shown in FIG. 10A was observed at the bottom of each nanohole 14.

From the result of the observation with the FE-SEM, it can be concluded that if the anodization of aluminum is terminated after the anodization current has decreased by 5% or greater from the steady-state current, nanoholes in an entirely cut-through form can be obtained. When the anodization was further continued until point E in FIG. 7, partial oxidation of the silicon substrate at the interface between the nanoholes and the substrate was observed in some samples. In this case, the interface between the nanoholes and the silicon substrate was oxidized into the form of porous silicon oxide. Furthermore, the observation has also revealed that it is possible to control the diameters of nanoholes by adjusting the pore widening time.

When the anodization was performed by applying a voltage to an electrode provided on one end of the aluminum film instead of applying the voltage to the back surface of the silicon substrate, the anodization of the aluminum film was completed earlier in areas near the electrode while a longer anodization time was required for areas far away from the electrode. That is, uniform anodization was not obtained. As a result, the bottom was not cut through in the nanoholes located in the areas far away from the electrode. This indicates that the electrode should be formed on the back surface of the silicon substrate to achieve uniform oxidation.

d) Etching of Si

Of the samples, those which were subjected to the pore widening process for 45 min after terminating the anodization at point D in FIG. 7 were further subjected to RF plasma dry etching in 6-sulfur fluoride ($SF_6$) gas. The dry etching was performed for 60 sec at a pressure of 50 mTorr with RF power of 300 W. After that, the cross section of the samples was again observed with the FE-SEM. Etched parts 121 were observed as shown in FIG. 12A. That is, the nanohole pattern was uniformly transferred to the surface of the silicon substrate as shown in FIG. 12A. This indicates that the anodized aluminum on the silicon substrate served as an excellent mask.

Second Embodiment

Nanoholes were produced in a similar manner to the first embodiment except that n-type silicon wafers with a resistivity of 0.01 $\Omega$cm were used as the substrate and that the anodization was terminated at point D in FIG. 7.

After producing the nanoholes on the n-type silicon substrate and performing the pore widening process in a similar manner to the first embodiment, Co was electro-deposited thereby forming catalytic fine particles inside the nanoholes. In the above electro-deposition process, a solution consisting of 5% $CoSO_4.7 H_2O$ and 2% $H_3BO_3$ was employed as a plating bath and the electro-deposition was performed for 10 sec under application of an AC voltage of 5 V.

One sample was etched by immersing the sample in a 1% aqueous solution of hydrofluoric acid for 10 sec before the electro-deposition process. Another sample was directly subjected to the electro-deposition process without being etched before the electro-deposition process.

The cross section of the samples were observed with the FE-SEM. The uniformity of the Co electro-deposition was better in samples which were subjected to the etching process.

The result of the present embodiment indicates that when a silicon substrate is employed as the substrate, it is desirable to perform the etching process after forming nanoholes by means of anodization to achieve good uniformity in the electro-deposition.

Third Embodiment

In this third embodiment, after anodizing aluminum in a similar manner to the second embodiment except that the pore widening was performed for 45 min, the obtained nanoholes were filled with Ni.

After the pore widening process, samples were etched by immersing them for 10 sec in a 1% aqueous solution of hydrofluoric acid in a similar manner to the second embodiment.

Figure 13:
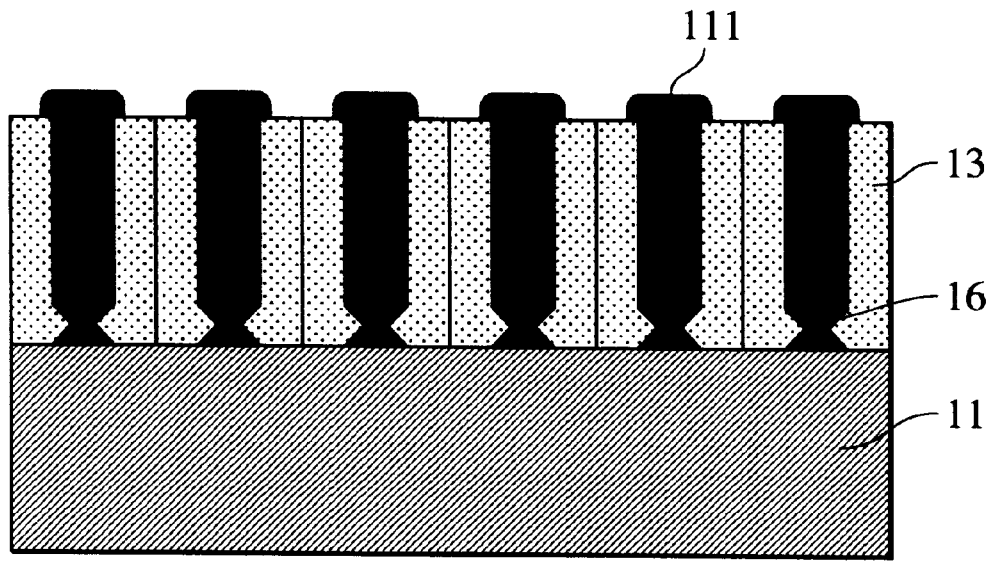
FIG. 13 is a cross-sectional view schematically illustrating a nanostructure obtained by embedding a filler in the nanoholes of the nanostructure shown in FIG. 2.

The cross section of the sample was observed with the FE-SEM. The observed cross-sectional structure is shown in FIG. 13. The cylinder-shaped nanoholes with a diameter of about 50 nm were observed to be filled with a Ni filler 111. A great number of nanoholes filled with the Ni filler were observed to be arranged at uniform intervals of about several hundred nm in directions parallel to each other.

The nanostructure produced according to the present embodiment was cooled to 4° K. by placing it in liquid helium, and the voltage-current characteristic between the Ni filler 111 and the silicon substrate 11 was evaluated. A nonlinear voltage-current characteristic was observed. This means that the nanostructure according to the present embodiment can be used in a magnetic memory and in a quantum effect device.

After diamond-polishing the surface of the sample subjected to the Ni electro-deposition, the sample was placed in a magnetic field of 0.5 T such that the magnetic filed is applied in a direction parallel to Ni cylinders 111 thereby magnetizing the Ni cylinders. After that, the sample was observed with an MFM (magnetic force microscope). The Ni cylinders 111 were observed to be magnetized in the axial direction of the nanoholes.

Comparative Example 1

Figure 3A:
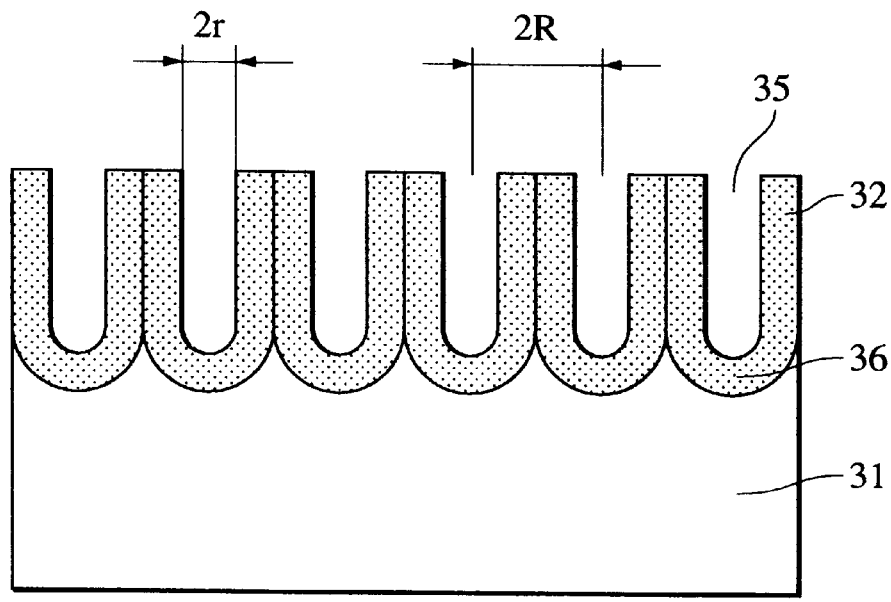
FIGS. 3A and 3B are, respectively, cross-sectional views schematically illustrating a conventional nanostructure on an aluminum plate and a semiconductor substrate.
Figure 3B:
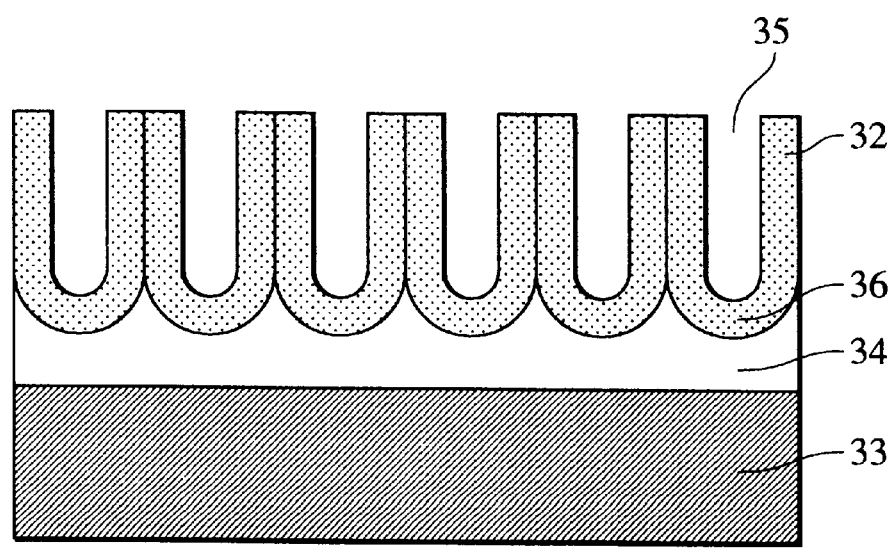
Figure 4:
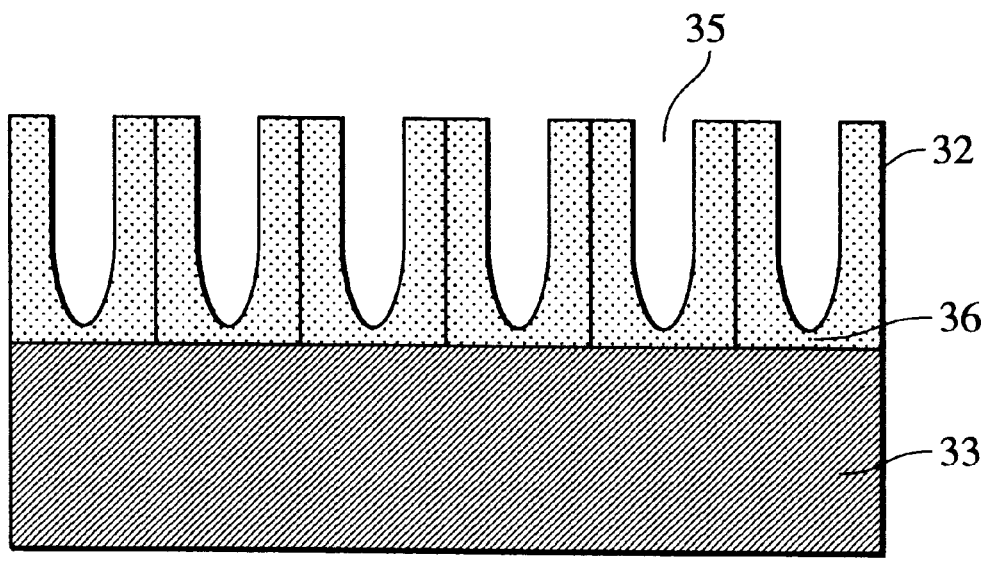
FIG. 4 is a cross-sectional view schematically illustrating a nanostructure formed by anodizing an aluminum film on a semiconductor substrate over the entire thickness of the aluminum film according to a conventional nanostructure production technique.
Figure 5:
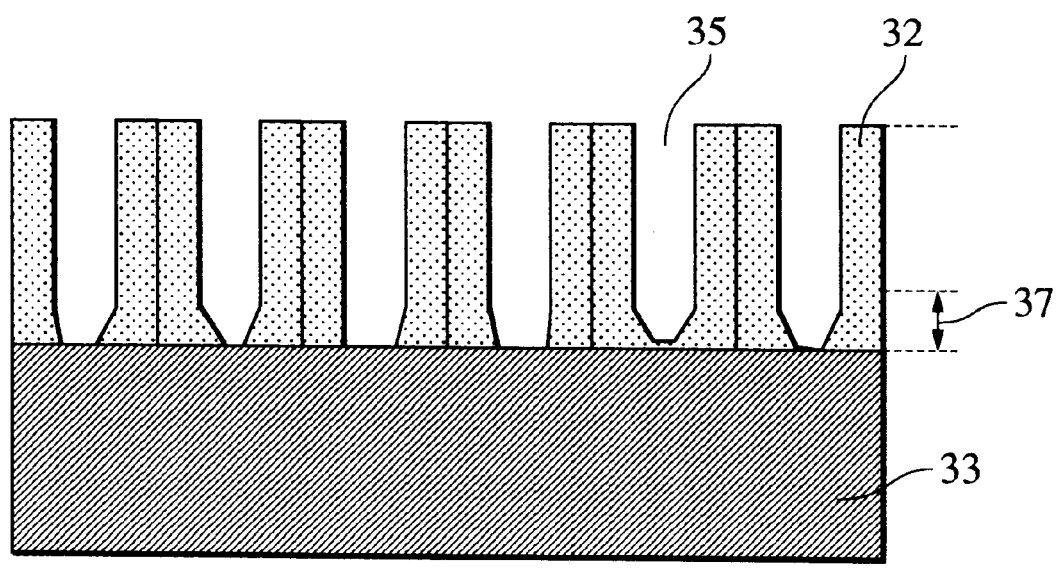
FIG. 5 is a cross-sectional view of a nanostructure obtained by removing, by means of etching, the barrier layer at the bottom of the nanoholes of the nanostructure shown in FIG. 4 so as to obtain completely-cut-through nanoholes.

For the purpose of comparison with the nanostructure according to the third embodiment, a nanostructure having the structure shown in FIG. 3B was produced by terminating the anodization before an aluminum film was completely anodized. After completion of the pore widening process, as in the third embodiment, the sample was immersed together with an opposite electrode made of carbon in an electrolyte consisting of 0.14 M $NiSO_4$ and 0.5 M $H_3BO_3$, and a 50 Hz AC voltage of 5 V was applied to the sample so that Ni was deposited at the bottom of the nanoholes.

However, after the above electro-deposition process, it turned out that the nanoholes of the comparative sample were not fully filled with Ni. Thus, the sample was further immersed in a solution consisting of 0.1 M $NiSO_4$, 0.24 M $NaPH_2O_2$, and 0.1 M $Na_4P_2O_7$ and Ni was deposited over the entire surface of the nanoholes by means of electroless deposition such that the nanoholes were fully filled with Ni. The comparative sample produced in the above-described manner was observed to have a dome structure at the bottom of the nanoholes, and the filler also had a similar shape. In contrast, in the sample according to the third embodiment of the present invention, the nanoholes had a cylindrical shape with a constant diameter over the entire length including the bottom of the nanoholes except for constricted parts formed near the bottom.

Fourth Embodiment

In the fourth embodiment, shown in FIG. 14, a metal filler with a multilayer structure was embedded in the nanoholes formed in an anodized film on a silicon substrate.

A nanostructure having completely-cut-through nanoholes was produced by anodizing an aluminum film on an n-type silicon substrate in a similar manner to the second embodiment except that the anodization was terminated at point D in FIG. 7 and that the pore widening was performed for 45 min. The sample was then etched with 1% hydrofluoric acid for 10 sec.

The sample was immersed together with an opposite electrode made of platinum in an electrolyte consisting of 0.5 cobalt sulfate and 0.001 M copper sulfate, and a 50 Hz AC voltage of 5 V was applied to the sample so that nuclei of Co-Cu alloy were precipitated at the bottom of the nanoholes. Subsequently, voltages of −0.2 V and −0.9 V were alternately applied for 15 sec and 1 sec, respectively, to the sample so that a Co-Cu multilayer film was grown at the bottom of the nanoholes. Thus, a nanostructure having the structure shown in FIG. 14 was obtained. In the above process, when the voltage of −0.2 V was applied, only Cu ions with higher noble electrode potential were electrodeposited while high-concentration Co ions were mainly electro-deposited when −0.9 V was applied. As a result, a multilayer film was obtained.

Furthermore, an electrode was formed at the top of the nanostructure obtained in the above-described manner according to the present embodiment, and the dependence of resistance between the filler and the silicon substrate on the magnetic field was evaluated. A negative magnetoresistance was observed. This means that the multilayer film embedded in the nanoholes has a GMR property. Another sample was produced in a similar manner except that the anodization was terminated at point E in FIG. 7. This sample exhibited a relatively small parasitic resistance.

As can be seen from the above description, the nanostructure according to the present embodiment can be employed in a magnetic sensor.

Fifth Embodiment

Heat Endurance

Nanoholes of the type shown in FIGS. 1 and 2 were produced on an n-type silicon substrate in a similar manner to the second embodiment, and the sample was subjected to a heat treatment so as to evaluate the heat endurance. For the purpose of comparison, a comparative sample having the structure shown in FIG. 3B was also produced by terminating the anodization of an aluminum film formed on a quartz substrate before the aluminum film was entirely anodized.

The sample having the nanoholes formed on the silicon substrate according to the present embodiment was heated at 700° C. in a He ambient. After the heat treatment, the change in structure was observed with the FE-SEM. The heat treatment for the comparative sample having the nanoholes on Al shown in FIG. 3B was performed at 500° C. taking into consideration the low meting point (660° C.) of Al.

The samples were observed with the FE-SEM before and after the heat treatment. Cracks were observed in the anodized film of the comparative sample after the heat treatment.

The nanoholes formed on the silicon substrate according to the present embodiment were observed to have the structure shown in FIG. 1 and no change in the structure was observed after the heat treatment.

Thus, it has turned out that the nanostructure including the nanoholes formed on the silicon substrate according to the present embodiment has excellent heat endurance. That is, nanoholes which can withstand high-temperature processes have been achieved. The samples were also observed with a TEM. The observation revealed that the aluminum oxide in which the nanoholes were formed had excellent crystal quality after the heat treatment. Furthermore, the acid resistance of the nanoholes formed in the anodized aluminum was evaluated before and after the heat treatment. It turned out that chemical stability was improved by the heat treatment.

Sixth Embodiment
Carbon Nanotube Device

Figure 18:
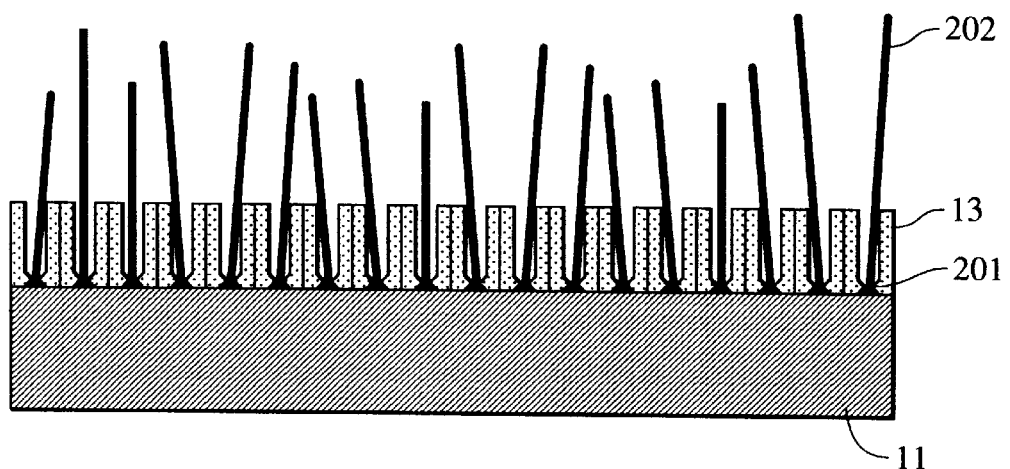
FIG. 18 is a cross-sectional view schematically illustrating a nanostructure obtained by embedding a carbon nanotube in the nanoholes of the nanostructure shown in FIG. 2.

After producing the nanoholes on the n-type silicon substrate and performing the pore widening process in a similar manner to the second embodiment, Co was electro-deposited thereby forming catalytic fine particles 201 inside the nanoholes as shown in FIG. 18. In the above electro-deposition process, a solution consisting of 5% $CoSO_4 \cdot 7H_2O$ and 2% $H_3BO_3$ was employed as a plating bath and the electro-deposition was performed for 1 sec under application of an AC voltage of 5 V.

Subsequently, the sample was heated at 700° C. for 1 hour in a mixed gas of 2% $C_2H_4$ and 98% He so that carbon nanotubes 202 were grown from the catalytic ultra-fine particles 201 as shown in FIG. 18.

The sample was observed with the FE-SEM. Carbon nanotubes extending outward from the inside of the nanoholes as shown in FIG. 18 were observed. The diameter of the carbon nanotubes ranged from 2 nm to 50 nm.

Figure 20:
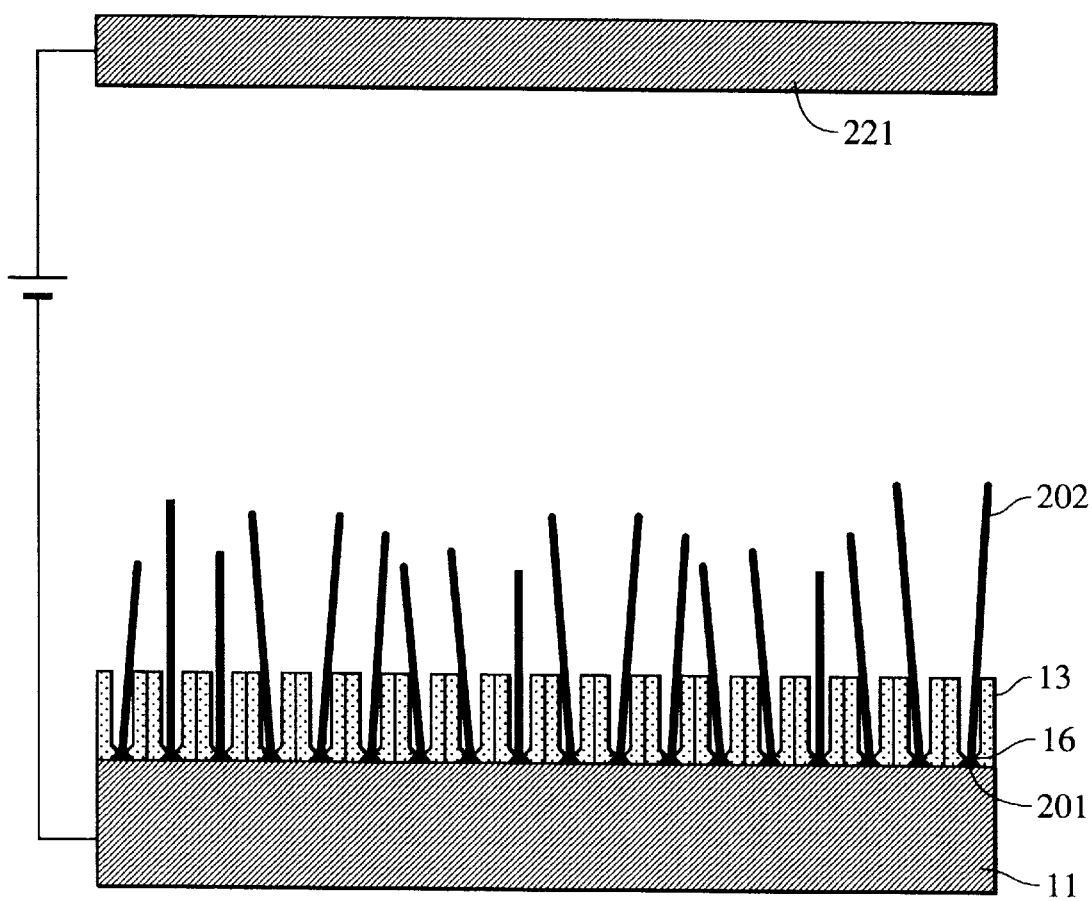
FIG. 20 is a cross-sectional view schematically illustrating an electron emitting device produced using the nanostructure shown in FIG. 18, according to an embodiment of the present invention.

Using the carbon nanotube device, an electron emitting device was produced as shown in FIG. 20. That is, an anode 221 including a phosphor was disposed 1 mm apart from the carbon nanotube device such that the anode 221 and the carbon nanotube device faced each other. They were placed in a vacuum chamber and a voltage of 1 kV was applied to the anode. Fluorescence from the phosphor and an electron emission current were observed.

As described above, it has turned out that the carbon nanotube device according to the present embodiment can serve as an excellent electron emitting device.

Seventh Embodiment

In this seventh embodiment, nanoholes were produced into a periodic regular pattern by anodizing an aluminum film on an InP substrate and the nanoholes were filled with an oxide.

An n-type InP substrate was employed as the substrate and aluminum was evaporated to a thickness of 1 μm on the substrate. The resistivity of the substrate employed was about 0.01 Ωcm.

Then recessed portions were produced at honeycomb (hexagonal lattice) locations on the surface of an aluminum film by using a lithography technique. The recessed portions were formed at intervals of 300 nm and the depth of the recessed portions was set to about 100 nm.

Then completely-cut-through nanoholes were produced on the InP substrate by performing anodization in a similar manner to the second embodiment except that a 5wt % solution of phosphoric acid was employed as the electrolyte, the voltage was set to 140 V, and the anodization was terminated at point D in FIG. 7 where anodization current became minimum. After that, the pore widening process was performed for 75 min.

After the pore widening process, the sample was immersed together with an opposite electrode made of platinum in a 0.1 M aqueous solution of zinc nitrate kept at 60° C. and a voltage of −0.8 V was applied to an Ag/AgCl standard electrode thereby growing ZnO crystal inside the nanoholes.

The surface of the sample was observed with the FE-SEM. The nanoholes formed in the anodized aluminum film in a regular fashion were observed. ZnO grown inside the nanoholes was also observed. Thus, the present embodiment has revealed that it is possible to embed ZnO in the nanoholes formed in the anodized aluminum film. Because ZnO can serve as a phosphor and has a dielectric constant different from that of the aluminum oxide in which ZnO is located, the structure according to the present embodiment can be applied to an optical device.

Eighth Embodiment

In this embodiment, nanoholes were produced by anodizing an aluminum film in a similar manner to the second embodiment except that a p-type silicon substrate with a resistivity of 1 Ωcm was employed as the substrate and the anodization was terminated at point D in FIG. 7.

After the pore widening process, the sample having nanoholes formed on the p-type silicon substrate was etched by immersing it for 10 sec in a 1% aqueous solution of hydrofluoric acid in a similar manner to the second embodiment.

Using a CVD apparatus designed to grow a polysilicon film, n-type silicon was grown on the surface of the silicon substrate at the bottom of the respective nanoholes until silicon had grown to the upper portion of the nanoholes.

The electric characteristic between the surface of the sample and the underlying p-type silicon substrate was evaluated. A good pn junction characteristic was observed.

As described above, according to the present embodiment, it is possible to produce a pn junction at the interface between a semiconductor substrate and a semiconductor inclusion embedded in nanoholes formed in an anodized film. This structure is useful to produce an electronic device.

Ninth Embodiment

The effects of the anodization time in the process of producing nanoholes by anodizing an aluminum film were investigated for various types of underlying layers. The result is described below.

In this embodiment, quartz substrates were employed and an underlying electrode layer with a thickness of 100 nm was formed using various metals including Mn, Fe, Co, Ni, Cu, Ag, Au, Pt, Pd, Ir, Os, Ru, and Rh.

a) Formation of an underlaying layer and Al film on a quartz substrate

After forming a film of Mn, Fe, Co, Ni, Cu, Ag, Au, Pt, Pd, Ir, Os, Ru, or Rh to a thickness of 100 nm on quartz substrates by means of RF sputtering, an aluminum film with a thickness of 500 nm was formed thereon. In the above process, the RF sputtering was performed using Ar gas at a pressure of 30 mTorr with RF power of 300 W.

b) Anodization

Anodization was performed using the anodization apparatus shown in FIG. 6.

In the present embodiment, a 0.3 M aqueous solution of oxalic acid was used as the electrolyte 63, and the electrolyte was kept at 17° C. using a temperature controlled bath 60. A DC voltage of 40 V was applied as the anodization voltage. The DC voltage was applied via an electrode formed on the underlying layer so as to achieve uniform anodization. The anodization current was monitored during the anodization process to detect a change in current indicating the completion of anodization over the entire thickness of the aluminum film from its surface to the underlying layer. The anodization was terminated at point C, D, or E in FIG. 9. In the case where Mn, Fe, Co, Ni, Cu, Pd, Ir, Os, Ru, or Rh was employed as the underlying layer, a relative large reduction in current was observed. On the other hand, a relative small reduction in current was observed for the underlying layers of Au, Ag, and Pt. The curve (b) shown in FIG. 9 represents the current change observed for the Pt underlying layer and the curve (a) represents the current change for the Pd underlying layer. C denotes a point at which the current started to decrease (the amount of reduction at point C is less than 5%). D denotes a minimum point, and E denotes a point where the anodization current has an increased value after the drop to the minimum point. The anodization for the samples with an underlying layer of Au, Ag, or Pt was terminated before the anodization current exceeded the steady-state value B'.

After the anodization process, the samples were cleaned with purified water and isopropyl alcohol.

c) Pore Widening Process

The diameters of nanoholes were expanded by immersing the samples in 5 wt % phosphoric acid for 20 to 45 min after the anodization process.

Evaluation (Structure Observation)

The surface and cross section of samples were observed with an FE-SEM (Field Emission-Scanning Electron Microscope).

Result

In those sample which were obtained by terminating the anodization at point C, although some nanoholes reached the surface of the underlying layer, a considerable number of nanoholes had a barrier layer remaining at the bottom. That is, all nanoholes were not fully cut through. When the anodization was terminated at point D, all nanoholes were formed in a fully cut-through structure reaching the surface of the underlying layer, and a constricted structure 16 such as that shown in FIG. 8 was observed near the bottom of each nanohole. On the other hand, in those samples which were obtained by terminating the anodization at point E, all nanoholes were formed in a fully cut-through structure reaching the surface of the underlying layer, and an expanded structure such as that shown in FIG. 10B was observed at the bottom of each nanohole. From the result of the observation with the FE-SEM, it can be concluded that if the anodization of aluminum is terminated after the anodization current has decreased by 5% or greater from the steady-state current, nanoholes in an entirely cut-through form can be obtained.

The diameter of the nanoholes increased with the pore widening time. This means that it is possible to control the diameters of nanoholes by adjusting the pore widening time.

For some samples, the anodization was performed by applying a voltage not via the electrode formed on the underlying layer but via an electrode formed on one end portion of the surface of the aluminum film. These samples showed the current change of the type denoted by the curve (c) in FIG. 9, and the anodization of the aluminum film was completed earlier for the part near the electrode and later for the part apart from the electrode. That is, uniform anodization was not achieved and those nanoholes located far apart from the electrode were not fully cut through. The above result indicates that the voltage should be applied uniformly via the underlying layer to achieve uniform oxidation.

Tenth Embodiment

Heat Endurance

Nanoholes of the type shown in FIGS. 1 and 2 were produced on an underlying material of Pt in a similar manner to the ninth embodiment, and the sample was subjected to a heat treatment so as to evaluate the heat endurance. For the purpose of comparison, a comparative sample having the structure shown in FIG. 3B was also produced by terminating the anodization of an aluminum film formed on a quartz substrate before the aluminum film was entirely anodized.

The sample having the nanoholes formed on the underlying material of Pt according to the present embodiment was heated at 700° C. in a He ambient. After the heat treatment, the change in structure was observed with the FE-SEM. The nanoholes formed on the underlying material of Pt according to the present embodiment were observed to have the structure shown in FIG. 1 and no change in the structure was observed after the heat treatment.

The heat treatment for the comparative sample having the nanoholes on Al shown in FIG. 3B was performed at 500° C. taking into consideration the low meting point (660° C.) of Al. The samples were observed with the FE-SEM before and after the heat treatment. Cracks were observed in the nanoholes formed in the anodized film of the comparative sample after the heat treatment.

Thus, it has turned out that the nanostructure including the nanoholes formed on the underlying material of Pt according to the present embodiment has excellent heat endurance. That is, nanoholes which can withstand high-temperature processes have been achieved.

The samples were also observed with a TEM. The observation revealed that the aluminum oxide in which the nanoholes were formed had excellent crystal quality after the heat treatment. Furthermore, the acid resistance of the nanoholes formed in the anodized aluminum was evaluated before and after the heat treatment. It turned out that chemical stability was improved by the heat treatment.

Eleventh Embodiment

In this embodiment, nanoholes were produced by anodizing an aluminum film in a similar manner to the ninth embodiment. In this embodiment, an underlying layer with a thickness of 100 nm was formed using various metals including Cu, Ag, Au, Pt, Pd, Ir, Os, Ru, and Rh. The anodization was terminated at point D in FIG. 9.

After performing the pore widening process for 45 min, Co was electro-deposited so that Co pillars was formed inside the nanoholes. In the above electro-deposition process, a solution consisting of 5% $CoSO_4 \cdot 7 H_2O$ and 2% $H_3BO_3$ was employed as a plating bath and the electro-deposition was performed for 20 sec under application of a DC voltage of −2 V.

Figure 15:
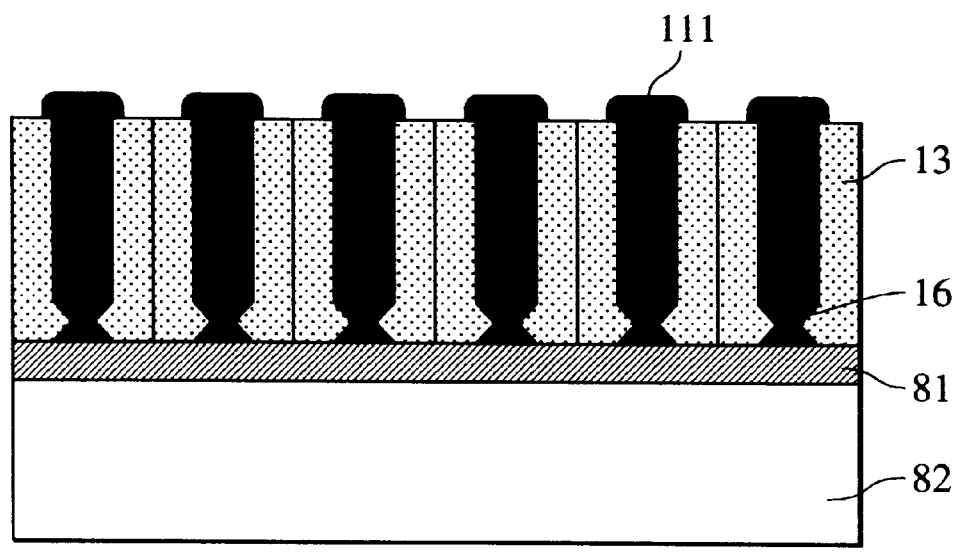
FIG. 15 is a cross-sectional view schematically illustrating a nanostructure obtained by embedding a filler in the nanoholes of the nanostructure shown in FIG. 8.

The cross section of the sample was observed with the FE-SEM. The observed cross-sectional structure is shown in FIG. 15. The cylinder-shaped nanoholes with a diameter of about 50 nm were observed to be filled with Co 111. These nanoholes were located at uniform interval of about 100 nm in the form of an array. The pillars had a constant diameter over the entire length from the top to the bottom of nanoholes except for a constricted structure formed near the bottom. The uniformity of the shape was better for those samples with the underlying layer of Cu, Pt, Au, Pd, or Ag.

The samples were then placed in a magnetic field of 0.8 T such that the magnetic filed was applied in a direction parallel to Co pillars, thereby magnetizing the Co pillars. After that, the samples were observed with the MFM (magnetic force microscope). The Co pillars were observed to be uniformly magnetized.

This means that the nanostructure according to the present embodiment can be used as a vertical magnetic film or the like in a magnetic device.

Twelfth Embodiment

In this embodiment, after producing nanoholes by anodizing an aluminum film in a similar manner to the eleventh embodiment, a metal filler with a multilayer form was embedded in the nanoholes formed in the anodized film. In this twelfth embodiment, the underlying layer was formed of Pt and the anodization was terminated at point D in FIG. 9.

Figure 16:
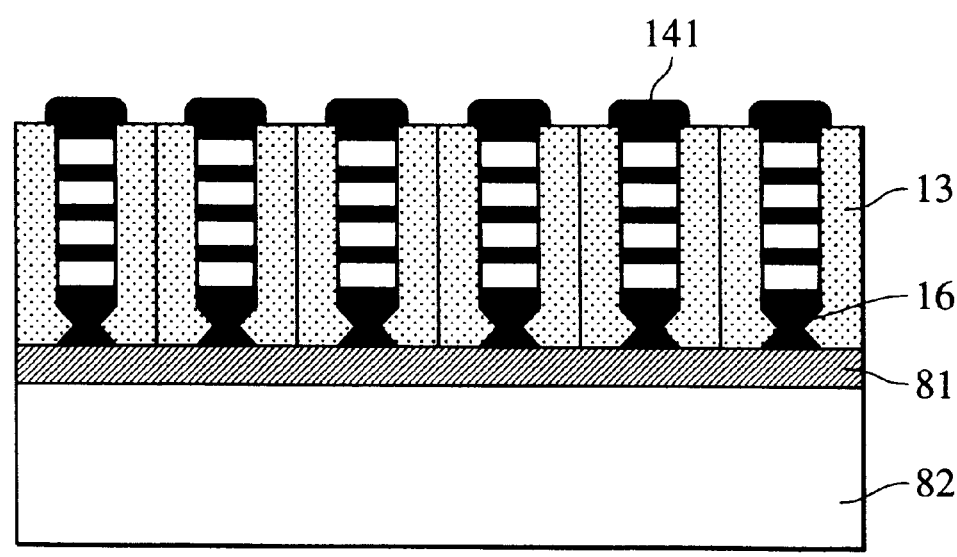
FIG. 16 is a cross-sectional view schematically illustrating a nanostructure obtained by embedding a metal multilayer in the nanoholes of the nanostructure shown in FIG. 8.

After producing nanoholes in a completely cut-through form on the Pt underlying layer in a similar manner to the ninth embodiment, the sample was immersed together with an opposite electrode made of platinum in an electrolyte consisting of 0.5 M cobalt sulfate and 0.001 M copper sulfate, and voltages of −0.2 V and −0.9 V were alternately applied for 15 sec and 1 sec, respectively, to the sample so that a Co-Cu multilayer film was grown at the bottom of the nanoholes thereby producing a nanostructure having the structure shown in FIG. 16.

In the above process, when the voltage of −0.2 V was applied, only Cu ions with higher noble electrode potential were electro-deposited while high-concentration Co ions were mainly electro-deposited when −0.9 V was applied. As a result, a multilayer film was obtained.

Furthermore, an electrode was formed at the top of the nanostructure obtained in the above-described manner according to the present embodiment, and the dependence of resistance between the filler and the underlying layer on the magnetic field was evaluated. A negative magnetoresistance was observed. This means that the multilayer film embedded in the nanoholes has a GMR property. Another sample was produced in a similar manner except that the anodization was terminated at point E in FIG. 9. This sample exhibited a relatively small parasitic resistance.

As can be seen from the above description, the nanostructure according to the present embodiment can be employed in a magnetic sensor.

Thirteenth Embodiment

In this embodiment, after producing nanoholes by anodizing an aluminum film in a similar manner to the eleventh embodiment, a metal filler with a multilayer form was embedded in the nanoholes formed in the anodized film.

Figure 17:
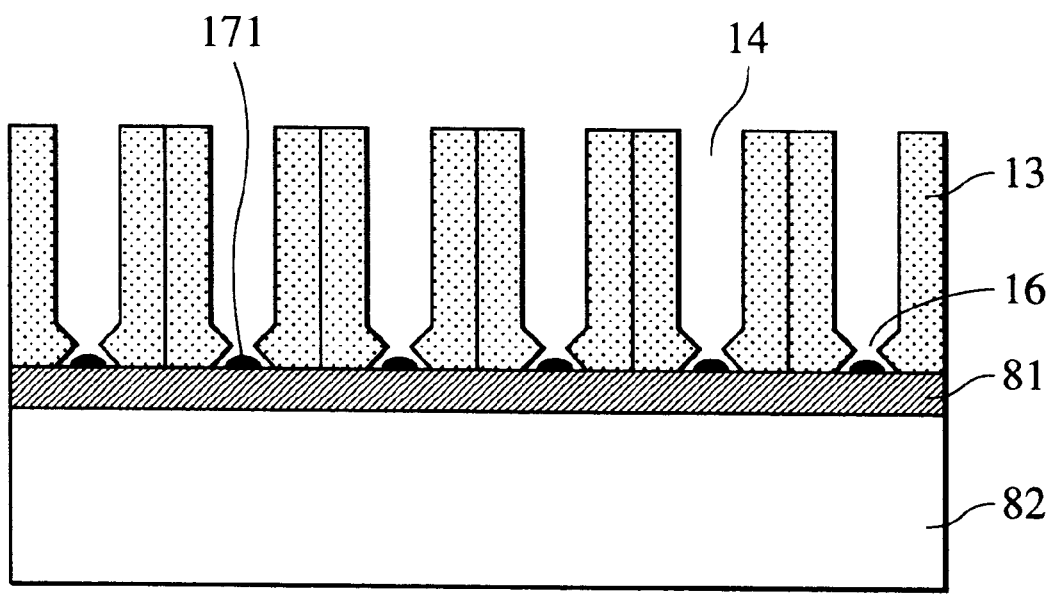
FIG. 17 is a schematic diagram illustrating a structure obtained by evaporating gold on the surface of a substrate using the anodized film with the nanostructure shown in FIG. 8 as a mask.

After forming completely-cut-through nanoholes on a Pd underlying layer 81 in a similar manner to the eleventh embodiment, the sample was placed in an sputtering apparatus and Ni was evaporated to a thickness of 2 nm. The obtained sample was observed with the FE-SEM. It turned out that Ni particles 171 in the form of spots were deposited on the surface of Pd via the aluminum oxide nanoholes serving as a mask, as shown in FIG. 17. Because of the constricted structure 14 of the nanoholes, the diameters of the obtained Ni spots 171 were as small as about 15 nm.

After oxidizing the surface of the sample in the air, the sample was immersed in a solution consisting of 0.1 M $NiSO_4$, 0.24 M $NaPH_2O_2$, and 0.1 M $Na_4P_2O_7$ and Ni was deposited over the entire surface of the nanoholes by means of electroless deposition such that the nanoholes were filled with Ni. After forming an electrode at the top of the obtained nanostructure, the nanostructure was cooled to 4° K. in liquid helium, and the voltage-current characteristic between the filler and the underlying layer was evaluated. A nonlinear voltage-current characteristic with a step was observed.

This means that the nanostructure according to the present embodiment can be used in a single-electron device and a quantum effect device.

Fourteenth Embodiment

Carbon Nanotube Device

A carbon nanotube device having a structure shown in FIG. 19 was produced using a method described below. After producing the nanoholes on the Pt underlying layer 81 and performing the pore widening process in a similar manner to the twelfth embodiment, Co was electro-deposited thereby forming catalytic fine particles 201 at the bottom of the nanoholes. In the above electro-deposition process, a solution consisting of 5% $CoSO_4.7 H_2O$ and 2% $H_3BO_3$ was employed as a plating bath and the electro-deposition was performed for 1 sec under application of a DC voltage of −3 V.

Subsequently, the sample was heated at 700° C. for 1 hour in a mixed gas of 2% $C_2H_4$ and 98% He so that carbon nanotubes 202 were grown from the catalytic ultra-fine particles.

Figure 19:
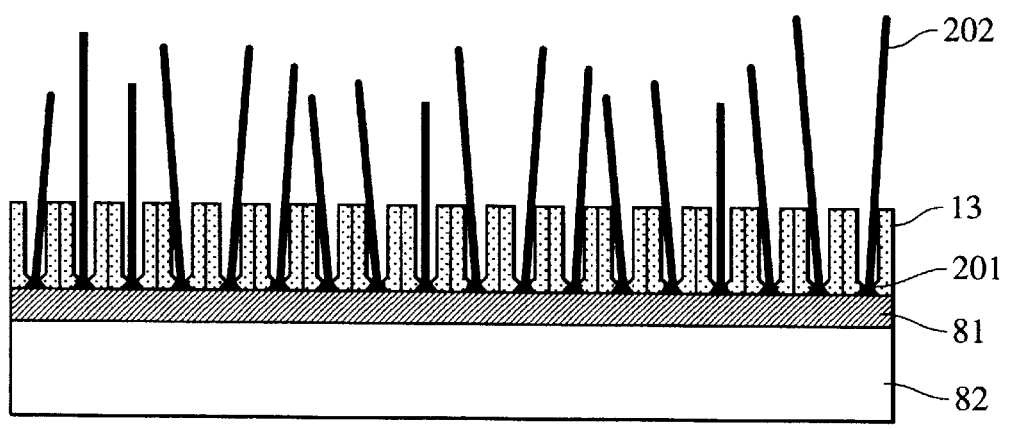
FIG. 19 is a cross-sectional view schematically illustrating a nanostructure obtained by embedding a carbon nanotube in the nanoholes of the nanostructure shown in FIG. 8.

The sample was observed with the FE-SEM and carbon nanotubes 202 extending outward from the inside of the nanoholes as shown in FIG. 19 were observed. The diameter of the carbon nanotubes 202 ranged from a few nm to a few ten run.

An anode including a phosphor was disposed 1 mm apart from the carbon nanotube device such that the anode and the carbon nanotube device faced each other. They were placed in a vacuum chamber and a voltage of 1 kV was applied to the anode. Fluorescence from the phosphor and an electron emission current were observed.

As described above, it has turned out that the carbon nanotube device according to the present embodiment can serve as an excellent electron emitting device.

Fifteenth Embodiment

In this embodiment, nanoholes were produced in a periodic form by means of anodization and then the nanoholes were filled with an oxide.

First, Au was deposited to a thickness of 100 nm on a quartz substrate by means of resistive heating evaporation. An aluminum film with a thickness of 1 $\mu$m was then evaporated thereon. Then recessed portions were produced at honeycomb (hexagonal lattice) locations on the surface of an aluminum film by using a lithography technique. The recessed portions were formed at intervals of 300 nm and the depth of the recessed portions was set to about 100 nm.

After that, nanoholes were formed on the Au film by means of anodization in a similar manner to the eleventh embodiment. In the anodization process, a 5 wt % solution of phosphoric acid was employed as the electrolyte and a voltage of 140 V was applied. The anodization was terminated at point D in FIG. 9 where anodization current became minimum. After that, the pore widening process was performed for 75 min.

After the pore widening process, the sample was immersed together with an opposite electrode made of platinum in a 0.1 M aqueous solution of zinc nitrate kept at 60° C. and a voltage of −0.8 V was applied to an Ag/AgCl standard electrode thereby growing ZnO crystals inside the nanoholes.

The surface of the sample was observed with the FE-SEM. The nanoholes formed in the anodized aluminum film in a regular fashion were observed. ZnO grown inside the nanoholes was also observed. Thus, the present embodiment has revealed that it is possible to embed ZnO in the nanoholes formed in the anodized aluminum film. Beca9 ZnO can serve as a luminous material or a phosphor and has a dielectric constant different from that of the aluminum oxide in which ZnO is located, the structure according to the present embodiment can be applied to an optical device or a light emitting device.

Sixteenth Embodiment

In this embodiment, a p-type region and an n-type region were first formed on the surface of a silicon substrate by means of a patterning technique, and nanoholes were produced by anodizing an aluminum film on the surface of the silicon substrate. The shape of the nanoholes and the selective electro-deposition technique were investigated. The result is described below.

First, a mirror polished single-crystal n-type Si substrate having a resistivity of $10^{-2}$ Ωcm was prepared as the Si substrate. Boron was implanted into a particular region defined by means of the patterning technique, and then annealing for recrystallization was performed thereby forming a patterning region (p-type region) 231 having a resistivity of $10^{-1}$ Ωcm, as shown in FIG. 21A. An aluminum film 232 was then formed on the surface on the substrate in a similar manner to the first embodiment. After that, the aluminum film 232 was anodized in a similar manner to the first embodiment. The anodization was terminated at point D (in FIG. 7). The cross section of the nanostructure obtained in the above-described manner was observed with the FE-SEM. It turned out that all nanoholes 14 located on the p-type region and on the n-type region were completely cut through the anodized film 13 from the surface of the anodized film to the surface of the Si substrate 11, as shown in FIG. 21B. The observation with the FE-SEM also revealed that a constricted structure 16 was formed near the bottom of each nanohole 14 as shown in FIG. 21B.

Figure 21D:
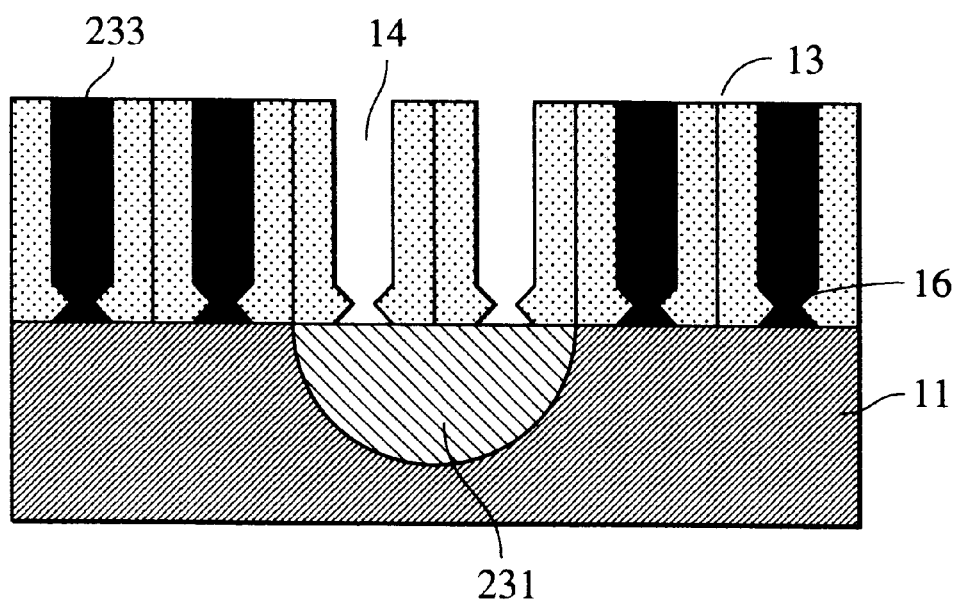

The sample was then immersed in a plating solution consisting of 5% $CoSO_4.7\,H_2O$ and 2% $H_3BO_3$ and the electro-deposition was performed for 30 sec under application of an AC voltage of 5 V to form Co 233 pillars in the nanoholes, as shown in FIGS. 21C and 21D.

After completion of the electro-deposition process, the cross section of the sample was observed with the FE-SEM. It turned out that Co pillars 233 were uniformly formed in the respective nanoholes located over the n-type region 11. However, substantially no Co pillars were observed over the p-type region 231. This means that it is possible to embed Co pillars only in the nanoholes on the n-type region by means of selective electro-deposition according to the present embodiment.

The sample was further subjected to RF plasma dry etching in 6-sulfur fluoride ($SF_6$) gas. The dry etching was performed for 60 sec at a pressure of 50 mTorr with RF power of 300 W. The cross section of the sample was again observed with the FE-SEM. It turned out that the surface of the substrate was etched only in the region having nanoholes with no Co pillars 233 and etched portions 121 were formed as shown in FIG. 24. That is, the nanohole pattern was transferred to the surface of the substrate. This indicates that the anodized film on the silicon substrate served as an excellent mask.

Seventeenth Embodiment

Figure 26:
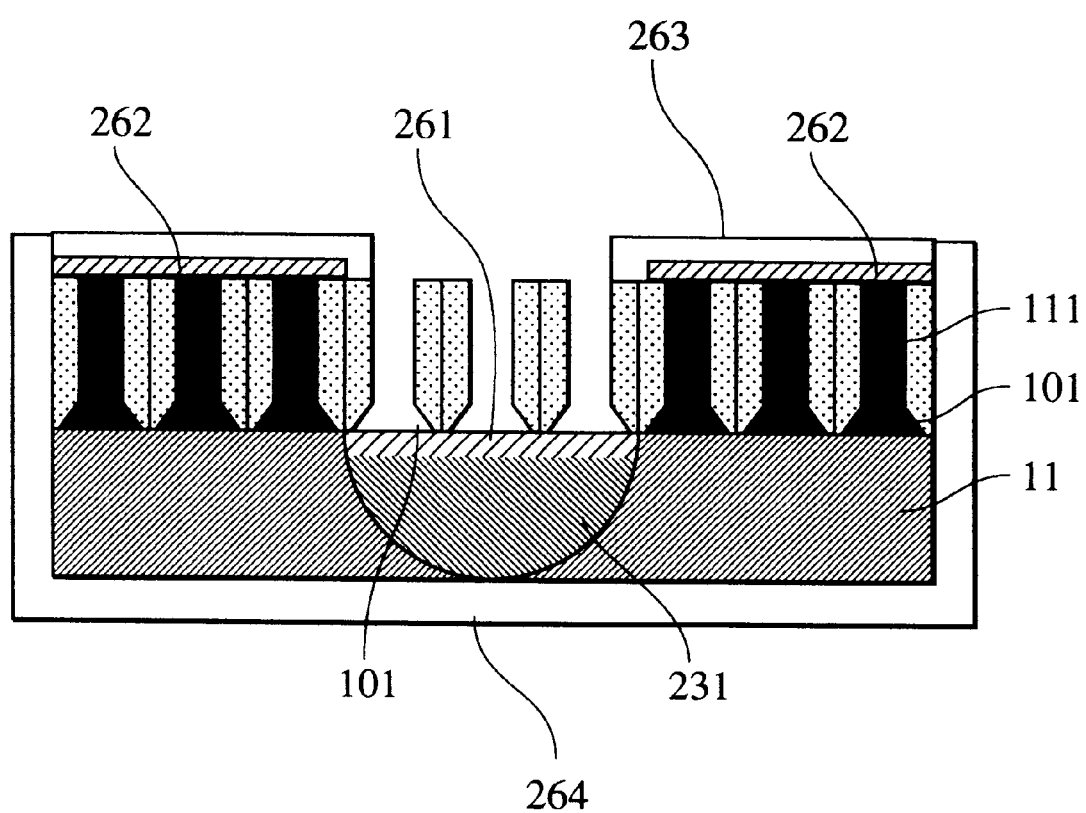
FIG. 26 is a cross-sectional view schematically illustrating an electrochemical sensor that is an example of a device according to an embodiment of the present invention.

In this embodiment, a plurality of n-type regions corresponding to an MOSFET pattern were formed on the surface of a silicon substrate and a p-type region was formed between two adjacent n-type regions, as shown in FIG. 26. The patterning was performed using a photolithography process and an ion implantation process which are widely used in the semiconductor production. The p-type region and the n-type region were formed so that they had a resistivity of 1 to 5 Ωcm.

Nanoholes were produced by anodizing an aluminum film in a similar manner to the first embodiment except that the anodization was terminated at point E in FIG. 7. The anodization was performed in 0.3 M sulfuric acid at 4° C. under application of 26 V. The pore widening was performed for 20 min. As a result of the above process, a porous oxide layer SiOx 261 was formed only in the p-type region on the surface of the silicon substrate.

Co 111 was electro-deposited inside the nanoholes formed in the anodized film, in a similar manner to the first embodiment. In the above electro-deposition process, a solution consisting of 5% $CoSO_4.7\,H_2O$ and 2% $H_3BO_3$ was employed as a plating bath and the electro-deposition was performed for 30 sec under application of an AC voltage of 5 V. As a result of the above electro-deposition process, Co was deposited only on the n-type silicon regions. Upper electrodes 262 were then connected to the n-type Si 11 via electro-deposited Co 111. Subsequently, an insulating layer 263 was formed on the surface of the anodized film except for the p-type region. After that, the sample was covered with a protective insulating film 264 so that no part except for the porous SiOx layer 261 will come in contact with a solution. The upper electrodes were connected to a voltage source and an ammeter so that the sample serves as an electrochemical sensor having means for measuring the electric characteristic among the n-p-n regions. The obtained electrochemical sensor was immersed together with a reference electrode in a $10^{-3}$ M solution of hydrogen peroxide. A change in the voltage-current characteristic from that obtain in purified water was observed. That is, the electrochemical sensor according to the present embodiment serves as an ion-sensitive field effect transistor having aluminum oxide nanoholes on the gate and having a porous SiOx layer under the aluminum oxide nanoholes.

The electrochemical sensor according to the present embodiment may be modified into a biosensor by fixing an enzyme or antibody in the nanoholes in the anodized film or to the porous SiOx layer. In particular, if the size of the nanoholes formed in the anodized film is set to a particular value, it is possible to realize an electrochemical sensor having a particular sensitivity to the size of chemical substance.

Eighteenth Embodiment

In this embodiment, shown in FIG. 25, a metal multilayer filler was embedded in nanoholes formed on a patterned Pt layer.

A platinum layer 244 was selectively formed in a particular region on the surface of a quartz substrate 243 by means of the lift-off technique as shown in FIG. 22B thereby obtaining a substrate 11. An aluminum film 13 with a thickness of 500 nm was formed on the surface of the substrate in a similar manner to the first embodiment. Subsequently, the aluminum film was anodized in a similar manner to the first embodiment. The anodization was terminated at point E in FIG. 9.

The sample was immersed together with an opposite electrode made of platinum in an electrolyte consisting of 0.5 M cobalt sulfate and 0.001 M copper sulfate, and a 50 Hz AC voltage of 5 V was applied to the sample so that nuclei of Co-Cu alloy were precipitated at the bottom of the nanoholes. Subsequently, voltages of −0.2 V and −0.9 V were alternately applied for 15 sec and 1 sec, respectively, to the sample so that a Co-Cu multilayer film was grown at the bottom of the nanoholes. Thus, a nanostructure having the structure shown in FIG. 25 was obtained. In the above process, when the voltage of −0.2 V was applied, only Cu ions with higher noble electrode potential were electro-deposited while high-concentration, Co ions were mainly electro-deposited when −0.9 V was applied. As a result, a multilayer film was obtained. An electrode was formed at the top of the nanostructure obtained in the above-described manner, and the dependence of resistance between the filler and the silicon substrate on the magnetic field was evaluated. A negative magnetoresistance was observed. As can be seen from the above description, the nanostructure according to the present embodiment can be employed as a patterned magnetic sensor.

Nineteen Embodiment

Figure 27:
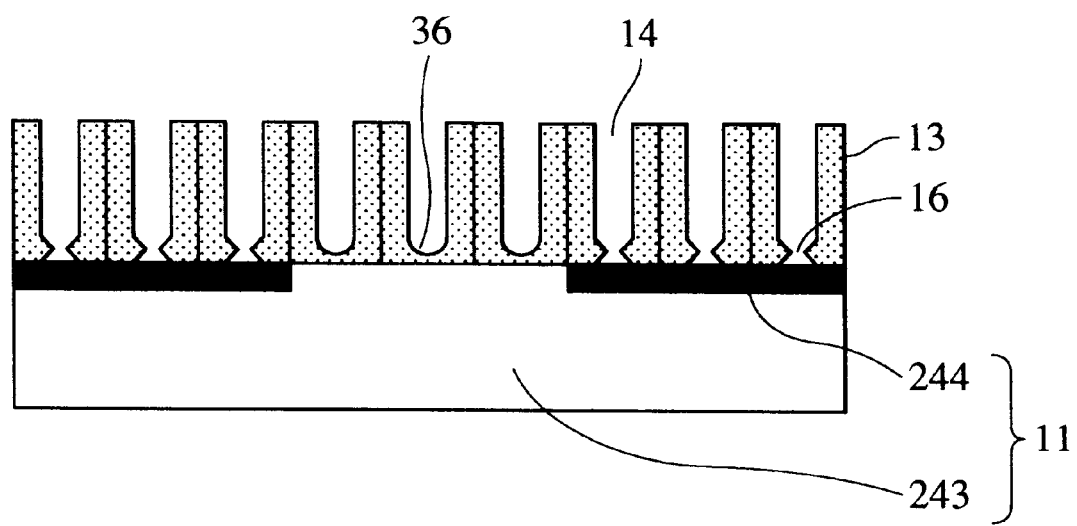
FIG. 27 a cross-sectional view schematically illustrating an electrochemical sensor that is another example of a device according to an embodiment of the present invention.

In this embodiment, shown in FIG. 27, an electrochemical sensor having aluminum oxide nanoholes formed on a underlying graphite layer patterned into a comb form was produced.

A carbon film with a thickness of about 100 nm was formed on a quartz substrate 243 by means of sputtering. After that, a comb-shaped electrode film 244 was formed by means of the lift-off technique. An aluminum film with a thickness of 500 nm was then formed on the substrate. The aluminum film was anodized in a similar manner to the eleventh embodiment. The anodization was terminated when the anodization current decreased to a minimum value (at point D in FIG. 9). After that, the pore widening process was performed for 45 min. Thus, a device having the structure shown in FIG. 27 was obtained. To evaluate the characteristics of the obtained sample, an electrode was formed on the underlying region patterned into a comb shape and the sample was placed together with a reference electrode and an opposite electrode in a solution such that unwanted regions do not come in contact with the solution. An aqueous solution of ferrocyanide (0.01 M) was employed as the solution. Cyclic voltammetry (voltage-current measurement) was performed and a clear oxidation-reduction peak was observed. Thus, it turned out that the sample according to the present embodiment can serve as an electrochemical sensor having a fine carbon electrode and a nanohole filter.

The electrochemical sensor according to the present embodiment may be modified into a biosensor by fixing an enzyme or antibody in the carbon nanoholes. In particular, if the size of the nanoholes formed in the anodized film is set to a particular value, it is possible to realize an electrochemical sensor having a particular sensitivity to the size of chemical substance.

As can be understood from the above description, the present invention has various advantages.

That is, according to the present invention, it is possible to produce a nanostructure including nanoholes formed in an anodized film on a substrate having an electrically conductive surface including a semiconductor, a noble metal, Mn, Fe, Co, Ni, Cu or carbon such that the nanoholes have an uniform shape and such that the nanoholes are completely cut through the anodized film form the surface of the anodized film to the surface of the electrically conductive surface. By embedding a metal, semiconductor, or oxide in the nanoholes, it becomes possible to realize a novel electronic device using the nanostructure.

By properly controlling the timing of the termination of the anodization process, it is possible to easily produce a nanostructure with an anodized film including nanoholes having good shape uniformity. The nanoholes produced by this method have a peculiar shape including a constricted part or an expanded part at the bottom of the nanoholes. The nanoholes with the constricted part have a very small opening. Therefore, the anodized film including such nanoholes can be advantageously used as a mask to form a fine pattern on the surface of a substrate. If an inclusion is embedded in the nanoholes with the expanded portion, it is possible to realize a high-reliability electric contact between the inclusion and the surface of the substrate.

If first and second regions having characteristics different from each other are formed on the surface of a substrate, and a nanostructure is produced on that substrate, it is possible to selectively give a particular function to only particular nanoholes. More specifically, after forming a p-type semiconductor region and an n-type semiconductor region on the surface of the substrate, or after forming regions having different carrier concentrations on the surface of the substrate, if nanoholes are produced by anodizing an aluminum film on the substrate, then it becomes possible to selectively embed an inclusion only in particular nanoholes located in a particular region by means of the difference in conductivity among the regions. This can be used to obtain a pattern of nanoholes or a pattern of inclusions. Furthermore, this technique can also be used to realize various types of devices such as a quantum effect device, an electrochemical sensor, an optical device, and a magnetic device. When a silicon underlying layer is employed and an inclusion is embedded using an electro-deposition technique or a CVD technique, if the silicon surface at the bottom of the nanoholes is cleaned by means of etching, it is possible to achieve an inclusion having good interface characteristics, good crystal quality, and good uniformity.

Furthermore, the aluminum oxide nanostructure formed on a semiconductor substrate has good temperature endurance. The crystal quality of such a nanostructure can be improved by performing a heat treatment. It is also possible to realize a carbon nanotube device in which carbon nanotubes are connected to an underlying semiconductor layer. That is, the invention makes it possible to use a nanostructure formed by means of anodization of aluminum in various manners in a wide variety of applications. The nanostructure itself according to the invention may also be used as a functional material. Furthermore, the nanostructure according to the invention may also be used as a base material or a mold to realize another novel nanostructure.

As described above, the nanostructure according to the present invention makes it possible to use the anodized film in various manners in a wide variety of applications such as a quantum wire, an MIM device, a biosensor, coloring, a magnetic storage medium, an EL device, an electrochromic device, an optical device, a solar cell, a gas sensor, a high abrasion resistance film, a high dielectric strength film, and a filter.

What is claimed is:

1. A nanostructure comprising:
  a substrate having a surface containing at least one material selected from the group consisting of semiconductors, noble metals, Mn, Fe, Co, Ni, Cu and carbon; and
  an anodized film disposed on the surface of said substrate, said anodized film having a nanohole,
  wherein said nanohole passes through said anodized film from the surface of said anodized film to the surface of said substrate, and said nanohole has a first diameter at the surface of said anodized film, and a second diameter at the surface of said substrate, and wherein said nanohole has a constriction at a location between the surface of said anodized film and the surface of said substrate, said constriction having a diameter smaller than said first and second diameters.

2. A nanostructure comprising:
  a substrate having a surface containing at least one material selected from the group consisting of semiconductors, noble metals, Mn, Fe, Co, Ni, Cu and carbon; and
  an anodized film disposed on the surface of said substrate, said anodized film having a nanohole,
  wherein said nanohole passes through said anodized film from the surface of said anodized film to the surface of said substrate, and said nanohole has a first diameter at the surface of said anodized film, and a second diameter at the surface of said substrate, and wherein said second diameter is greater than said first diameter.

3. A nanostructure according to claim 1 or 2, wherein the surface of said substrate is formed of a semiconductor oxide.

4. A nanostructure according to claim 3, wherein the surface of said substrate is porous.

5. A nanostructure according to claim 1 or 2, wherein the semiconductor is Si.

6. A nanostructure according to claim 1 or 2, wherein the noble metal is selected from the group consisting of Ag, Au, Pt, Pd, Ir, Rh, Os and Ru.

7. A nanostructure according to claim 1 or 2, wherein the carbon is selected from the group consisting of graphite, glassy carbon and amorphous carbon.

8. A nanostructure according to claim 1 or 2, wherein an inclusion is embedded in said nanohole.

9. An electron emitting device comprising:
  a nanostructure comprising a substrate having a surface containing at least one material selected from the group consisting of semiconductors, noble metals, Mn, Fe, Co, Ni, Cu and carbon, and an anodized film disposed on the surface of said substrate, said anodized film having a nanohole, a carbon nanotube which is embedded in the nanohole such that one end of said carbon nanotube is connected to the surface of said substrate; said nanohole passing through said anodized film from the surface of said anodized film to the surface of said substrate, wherein said nanohole has a first diameter at the surface of said anodized film, and a second diameter at the surface of said substrate, and wherein said second diameter is greater than said first diameter;
  an electrode disposed such that said electrode and the surface of said substrate face each other; and
  means for applying a voltage between the surface of said substrate and said electrode.

10. A nanostructure according to claim 1 or 2, wherein said anodized film has an additional nanohole and the surface of said substrate includes first and second regions which are different in resistance.

11. A nanostructure according to claim 1 or 2, wherein said anodized film has an additional nanohole and the surface of said substrate includes first and second regions which are different, wherein an inclusion is embedded only in the nanohole located on said first region.

12. A nanostructure according to claim 1 or 2, wherein said anodized film has an additional nanohole and the surface of said substrate includes first and second regions, wherein said first region is an n-type semiconductor region and said second region is a p-type semiconductor region.

13. A nanostructure according to claim 1 or 2, wherein said anodized film has an additional nanohole and the surface of said substrate includes first and second regions, wherein said first region is an electrically conductive region and said second region is an electrically insulating region.

14. A nanostructure according to claim 13, wherein said first region is a semiconductor region.

15. A nanostructure according to claim 14, wherein said semiconductor region is an n-type semiconductor region.

16. A nanostructure according to claim 8, wherein said inclusion is a magnetic structure.

17. A nanostructure according to claim 16, wherein said magnetic structure includes a ferromagnetic material and a non-magnetic material which are multilayered.

18. A nanostructure according to claim 8, wherein a substance having a capability of emitting light is embedded in said nanohole.

19. A nanostructure according to claim 18, wherein said substance having the capability of emitting light is a substance having a capability of emitting light by means of fluorescence.

20. A nanostructure according to claim 8, wherein a substance having a carrier type opposite to that of the semiconductor forming the surface of said semiconductor is embedded in the nanoholes.

21. A nanostructure according to claim 8, wherein the anodized film comprises aluminum oxide, and a substance having a dielectric constant different from that of the aluminum oxide is embedded in the nanohole.

22. A nanostructure according to claim 8, wherein a carbon nanotube is embedded in the nanohole such that one end of said carbon nanotube is connected to the surface of said substrate.

23. A nanostructure according to claim 8, wherein:
  said substrate includes an n-type semiconductor surface region located under the nanohole; and
  a carbon nanotube is embedded in the nanohole located on the n-type semiconductor region, with one end of said carbon nanotube is connected to the surface of said n-type semiconductor.

24. An electron emitting device comprising:
  a nanostructure comprising a substrate having a surface containing at least one material selected from the group consisting of semiconductors, noble metals, Mn, Fe, Co, Ni, Cu and carbon, and an anodized film disposed on the surface of said substrate, said anodized film having a nanohole, a carbon nanotube which is embedded in the nanohole such that one end of said carbon nanotube is connected to the surface of said substrate, said nanohole passing through said anodized film from the surface of said anodized film to the surface of said substrate, wherein said nanohole has a first diameter at the surface of said anodized film, and a second diameter at the surface of said substrate, and wherein said nanohole has a constriction having a diameter smaller than said first and second diameter, at a location between the surface of said anodized film and the surface of said substrate;
  an electrode disposed such that said electrode and the surface of said substrate face each other; and
  means for applying a voltage between the surface of said substrate and said electrode.

* * * * *

UNITED STATES PATENT AND TRADEMARK OFFICE
CERTIFICATE OF CORRECTION

PATENT NO. : 6,278,231 B1
DATED : August 21, 2001
INVENTOR(S) : Tatsuya Iwasaki et al.

It is certified that error appears in the above-identified patent and that said Letters Patent is hereby corrected as shown below:

Title page,
Item [56], OTHER PUBLICATIONS, "-Porosity" should read -- Porosity --.

Column 1,
Line 64, "A various" should read -- Various --.

Column 2,
Line 6, "application" should read -- applications --.

Column 3,
Line 6, "an" should read -- a --.
Line 22, "an" should read -- a --.

Column 4,
Line 30, "an" should read -- a --.

Column 5,
Line 6, "there" should read -- there is --.

Column 6,
Line 66, "27" should read -- 27 is --.

Column 7,
Line 51, "temperate" should read -- temperature --.

Column 10,
Line 43, "do" should read -- does --.

Column 15,
Line 66, "sample" should read -- samples --.

Column 16,
Line 7, "of the" should read -- whether the --.

Column 17,
Line 6, "section" should read -- sections --.
Line 43, "filed" should read -- field --.

Column 21,
Line 41, "sample" should read -- samples --.

UNITED STATES PATENT AND TRADEMARK OFFICE
CERTIFICATE OF CORRECTION

PATENT NO. : 6,278,231 B1
DATED : August 21, 2001
INVENTOR(S) : Tatsuya Iwasaki et al.

It is certified that error appears in the above-identified patent and that said Letters Patent is hereby corrected as shown below:

Column 22,
Line 55, "was" should read -- were --.

Column 23,
Line 6, "filed" should read -- field --.

Column 25,
Line 12, "Beca9" should read -- Because --.

Column 28,
Line 5, "an" should read -- a --.

Signed and Sealed this

Fourteenth Day of May, 2002

*Attest:*

JAMES E. ROGAN
*Attesting Officer*  *Director of the United States Patent and Trademark Office*